US010867846B2

(12) United States Patent
Chen et al.

(10) Patent No.: US 10,867,846 B2
(45) Date of Patent: Dec. 15, 2020

(54) FIN FIELD EFFECT TRANSISTOR (FINFET) DEVICE STRUCTURE WITH PROTECTION LAYER AND METHOD FOR FORMING THE SAME

(71) Applicant: Taiwan Semiconductor Manufacturing Co., Ltd., Hsinchu (TW)

(72) Inventors: Chien-Yuan Chen, Taichung (TW); Chen-Ming Lee, Taoyuan (TW); Fu-Kai Yang, Hsinchu (TW); Mei-Yun Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 98 days.

(21) Appl. No.: 16/124,527

(22) Filed: Sep. 7, 2018

(65) Prior Publication Data
US 2019/0148225 A1 May 16, 2019

Related U.S. Application Data

(60) Provisional application No. 62/586,361, filed on Nov. 15, 2017.

(51) Int. Cl.
*H01L 23/522* (2006.01)
*H01L 21/768* (2006.01)
*H01L 29/78* (2006.01)
*H01L 29/66* (2006.01)
(Continued)

(52) U.S. Cl.
CPC .... *H01L 21/76849* (2013.01); *H01L 23/5226* (2013.01); *H01L 23/53209* (2013.01); *H01L 29/41791* (2013.01); *H01L 29/66795* (2013.01); *H01L 29/785* (2013.01); *H01L 21/7684* (2013.01); *H01L 21/76831* (2013.01); *H01L 21/76844* (2013.01)

(58) Field of Classification Search
CPC ......... H01L 29/66795; H01L 21/28562; H01L 21/76883; H01L 21/76897
See application file for complete search history.

(56) References Cited

U.S. PATENT DOCUMENTS

| | | | |
|---|---|---|---|
| 2002/0121699 A1* | 9/2002 | Cheng | H01L 21/76843 257/758 |
| 2007/0257323 A1* | 11/2007 | Tsui | H01L 23/485 257/382 |
| 2017/0263557 A1* | 9/2017 | Clevenger | H01L 23/5283 |

* cited by examiner

*Primary Examiner* — Dale E Page
*Assistant Examiner* — Wilner Jean Baptiste
(74) *Attorney, Agent, or Firm* — Birch, Stewart, Kolasch & Birch, LLP

(57) ABSTRACT

A method for forming a FinFET device structure is provided. The method includes forming a gate structure over a fin structure. The method also includes forming an S/D contact structure over a S/D structure and depositing a protection layer over the S/D contact structure. The protection layer and the S/D contact structure are made of different materials. The method further includes forming an etching stop layer over the protection layer and forming a dielectric layer over the etching stop layer. The method includes forming a first recess through the dielectric layer and the etching stop layer to expose the protection layer and forming an S/D conductive plug in the first recess. The S/D conductive plug includes a barrier layer directly on the protection layer, and the protection layer and the barrier layer are made of different materials.

20 Claims, 35 Drawing Sheets

(51) Int. Cl.
*H01L 23/532* (2006.01)
*H01L 29/417* (2006.01)

US 10,867,846 B2

FIN FIELD EFFECT TRANSISTOR (FINFET) DEVICE STRUCTURE WITH PROTECTION LAYER AND METHOD FOR FORMING THE SAME

CROSS REFERENCE TO RELATED APPLICATIONS

This Application claims the benefit of U.S. Provisional Application No. 62/586,361, filed on Nov. 15, 2017, and entitled "Fin field effect transistor (FinFET) device structure and method for forming the same", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2B-1, 2C-1 and 2C-2 show cross-sectional representations of forming the protection layer, in accordance with some embodiments of the disclosure.

DETAILED DESCRIPTION

Figure 1A:
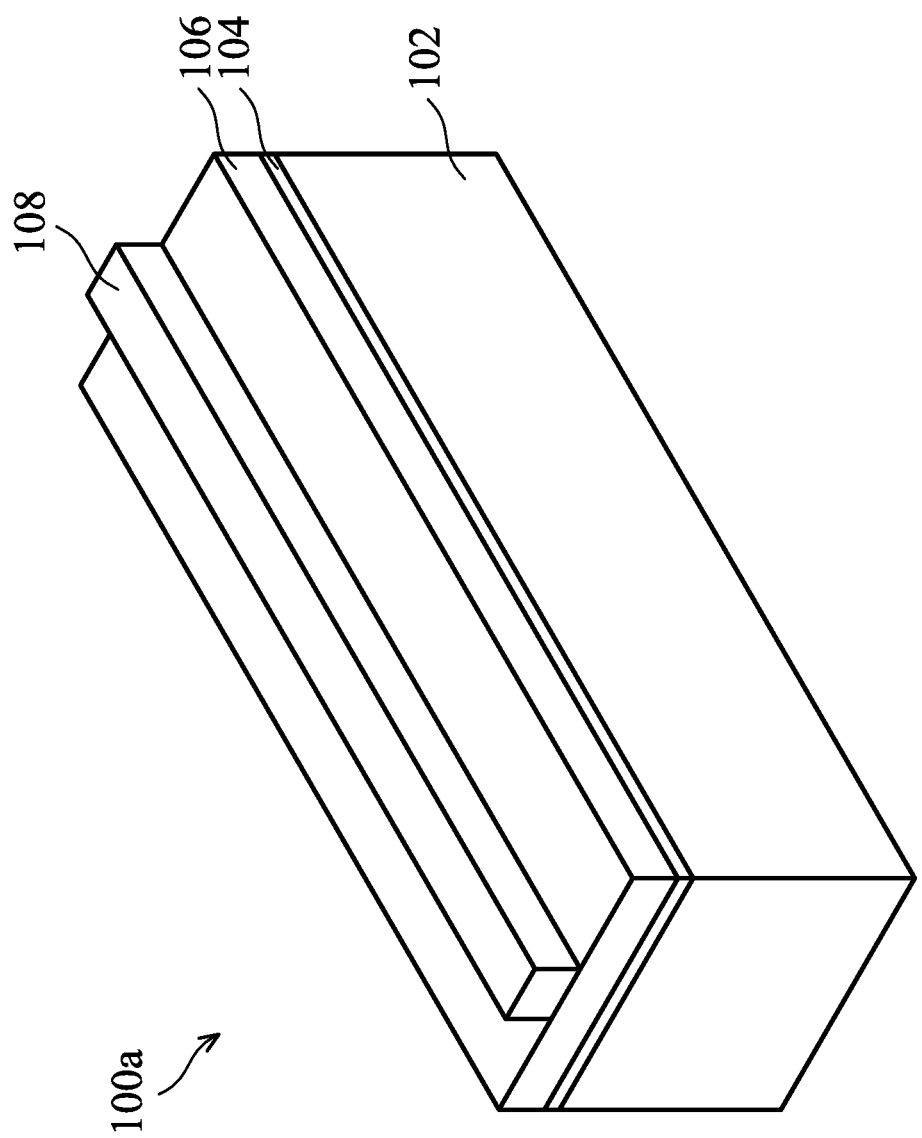
FIGS. 1A-1P show perspective representations of various stages of forming a FinFET device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Embodiments for forming a fin field effect transistor (FinFET) device structure are provided. FIGS. 1A-1P show perspective representations of various stages of forming a FinFET device structure 100a, in accordance with some embodiments of the disclosure.

Referring to FIG. 1A, a substrate 102 is provided. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

Afterwards, a dielectric layer 104 and a mask layer 106 are formed over the substrate 102, and a photoresist layer 108 is formed over the mask layer 106. The photoresist layer 108 is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process may include a dry etching process or a wet etching process.

The dielectric layer 104 is a buffer layer between the substrate 102 and the mask layer 106. In addition, the dielectric layer 104 is used as a stop layer when the mask layer 106 is removed. The dielectric layer 104 may be made of silicon oxide. The mask layer 106 may be made of silicon oxide, silicon nitride, silicon oxynitride, or another applicable material. In some other embodiments, more than one mask layer 106 is formed over the dielectric layer 104.

The dielectric layer 104 and the mask layer 106 are formed by deposition processes, such as a chemical vapor deposition (CVD) process, a high-density plasma chemical vapor deposition (HDPCVD) process, a spin-on process, a sputtering process, or another applicable process.

Figure 1B:
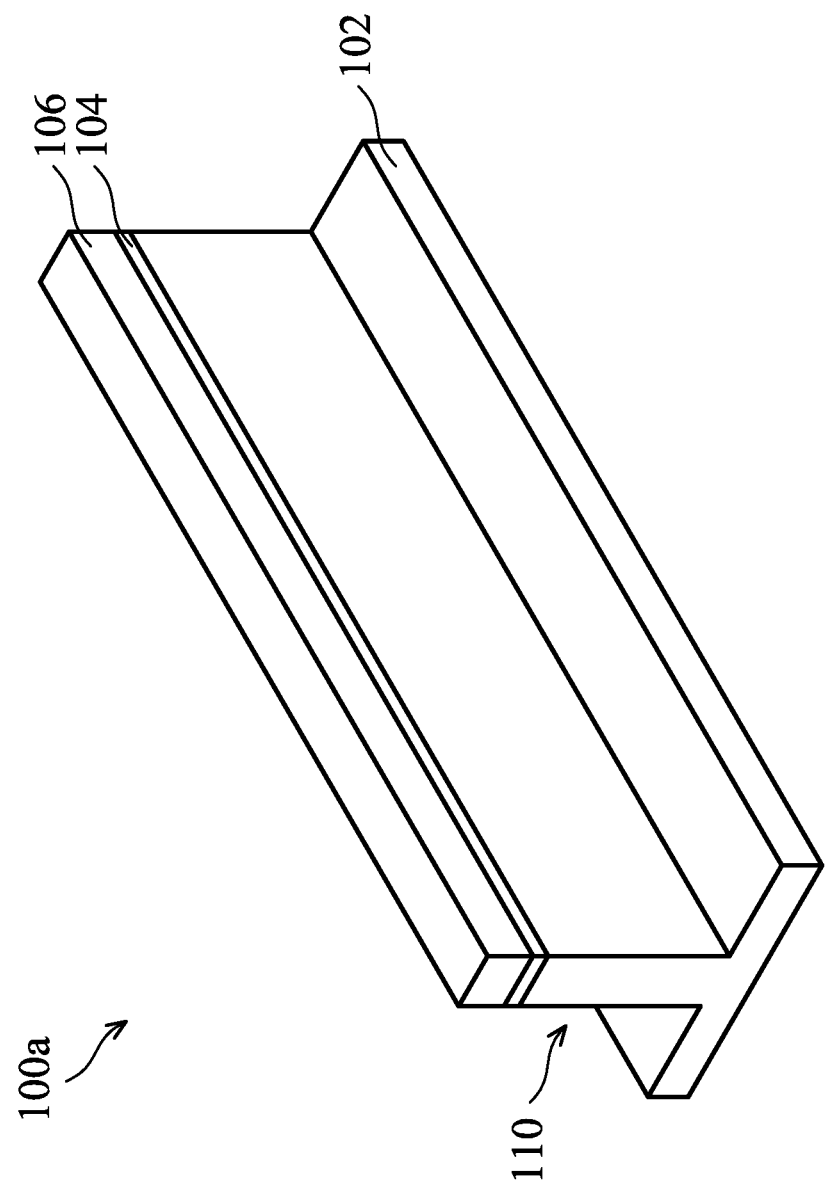

As shown in FIG. 1B, after the photoresist layer 108 is patterned, the dielectric layer 104 and the mask layer 106 are patterned by using the patterned photoresist layer 108 as a mask, in accordance with some embodiments. As a result, a patterned pad layer 104 and a patterned mask layer 106 are obtained. Afterwards, the patterned photoresist layer 108 is removed.

Next, an etching process is performed on the substrate 102 to form a fin structure 110 by using the patterned dielectric layer 104 and the patterned mask layer 106 as a mask. The etching process may be a dry etching process or a wet etching process.

In some embodiments, the substrate 102 is etched using a dry etching process. The dry etching process includes using a fluorine-based etchant gas, such as $SF_6$, $C_xF_y$, $NF_3$ or a combination thereof. The etching process may be a time-controlled process, and continue until the fin structure 110 reaches a predetermined height. In some other embodiments, the fin structure 110 has a width that gradually increases from the top portion to the lower portion.

Figure 1C:
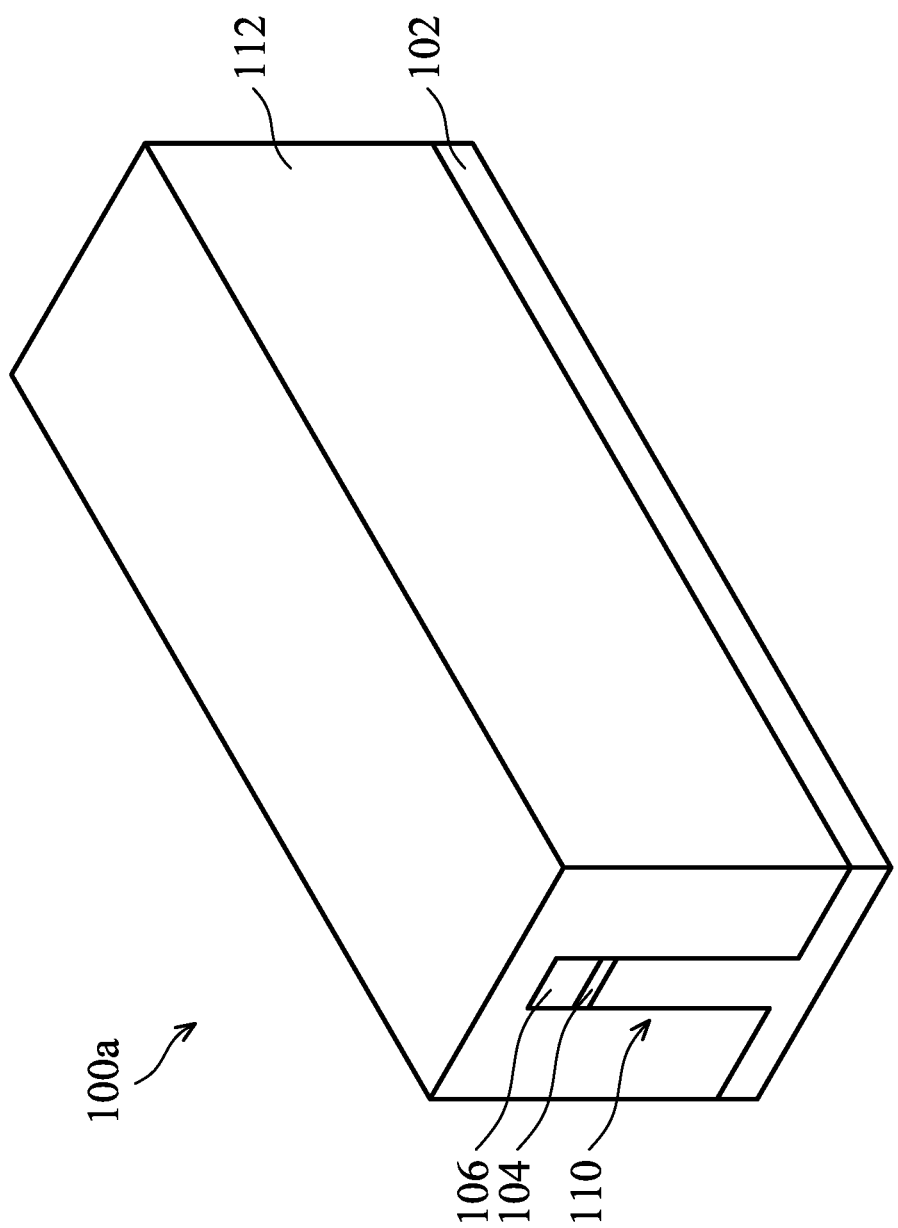

As shown in FIG. 1C, after the fin structure 110 is formed, an insulating layer 112 is formed to cover the fin structure 110 over the substrate 102, in accordance with some embodiments.

In some embodiments, the insulating layer 112 is made of silicon oxide, silicon nitride, silicon oxynitride, fluoride-doped silicate glass (FSG), low-k dielectric material or another applicable material. The insulating layer 112 may be deposited by a chemical vapor deposition (CVD) process, a spin-on-glass process, or another applicable process.

Afterwards, the insulating layer 112 is thinned or planarized to expose the top surface of the patterned mask layer 106. In some embodiments, the insulating layer 112 is thinned by a chemical mechanical polishing (CMP) process.

Figure 1D:
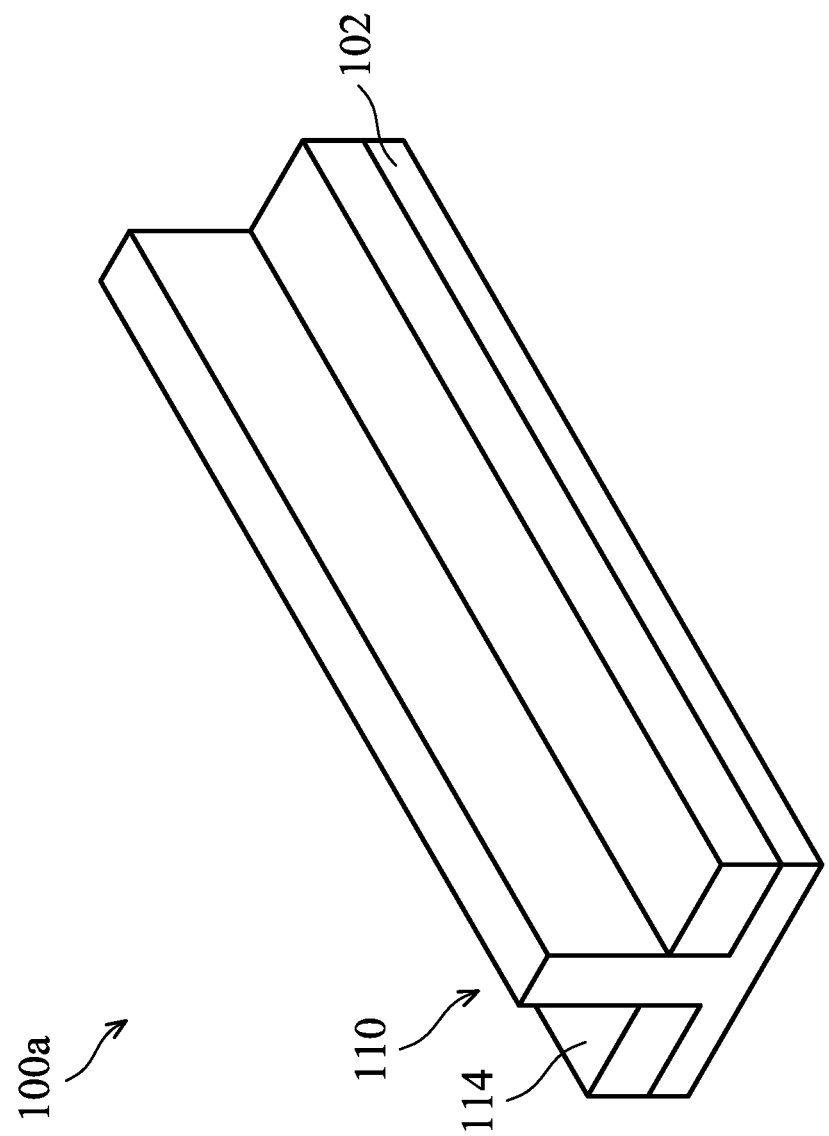

Afterwards, as shown in FIG. 1D, the patterned dielectric layer 104 and the patterned mask layer 106, and a portion of the insulating layer 112 is removed by an etching process, in accordance with some embodiments. As a result, an isolation structure 114 is obtained. The isolation structure 114 may be a shallow trench isolation (STI) structure surrounding the fin structure 110. A lower portion of the fin structure 110 is surrounded by the isolation structure 114, and an upper portion of the fin structure 110 protrudes from the isolation structure 114. In other words, a portion of the fin structure 110 is embedded in the isolation structure 114. The isolation structure 114 prevents electrical interference and crosstalk.

Figure 1E:
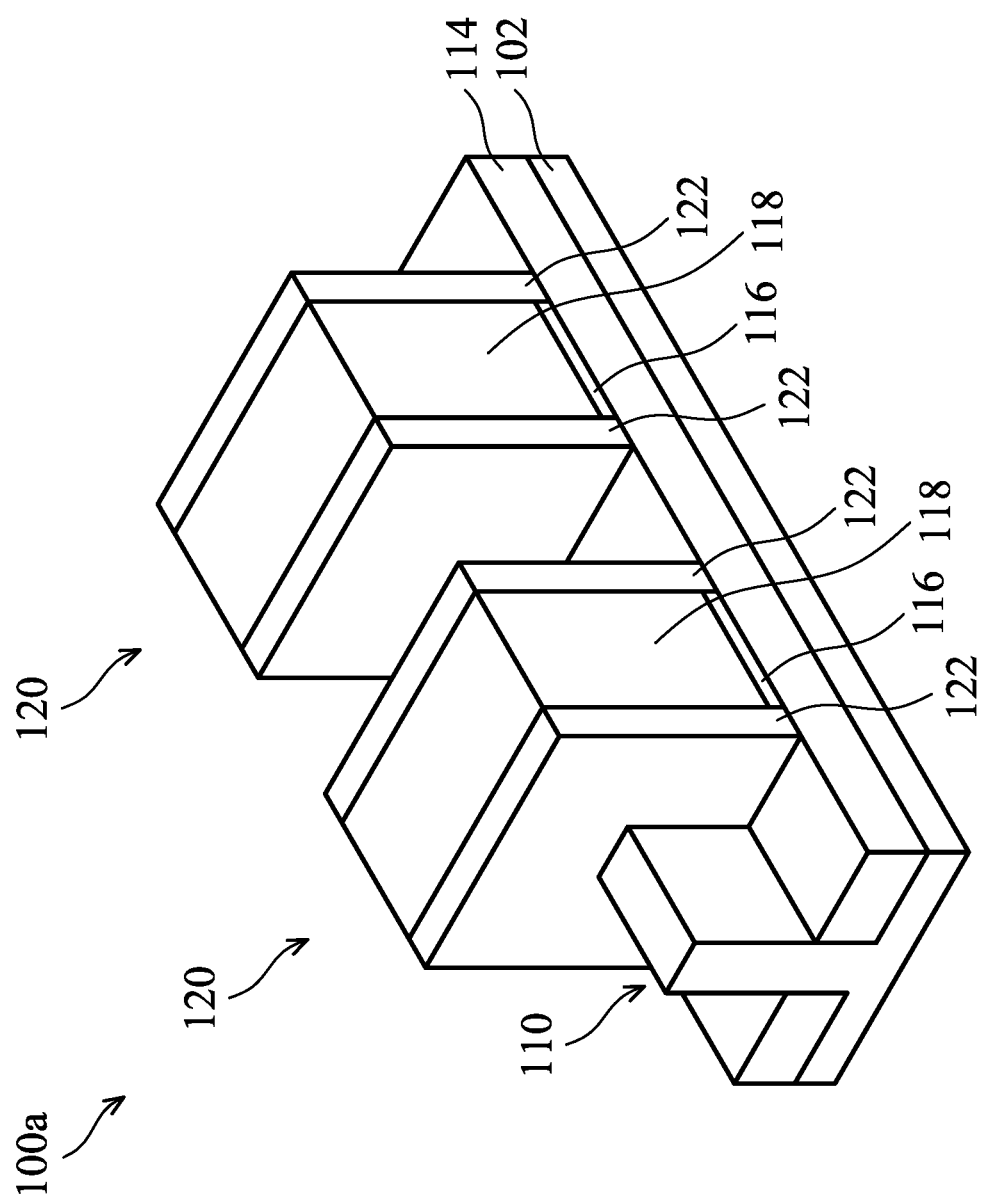

Afterwards, as shown in FIG. 1E, a dummy gate structure 120 is formed across the fin structure 110 and extends over the isolation structure 114, in accordance with some embodiments. In some embodiments, the dummy gate structure 120 includes a dummy gate dielectric layer 116 and a dummy gate electrode layer 118 formed over the dummy gate dielectric layer 116. In some embodiments, the dummy gate dielectric layer 116 includes silicon oxide, and the dummy gate electrode layer 118 includes polysilicon. After the dummy gate structure 120 is formed, the gate spacer layers 122 are formed on opposite sidewall surfaces of the dummy gate structure 120. The gate spacer layers 122 may be a single layer or multiple layers.

In order to improve the speed of the FinFET device structure 100a, the gate spacer layers 122 are made of low-k dielectric materials. In some embodiments, the low-k dielectric materials has a dielectric constant (k value) is less than 4. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

In some other embodiments, the gate spacer layers 122 are made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), or porous silicon oxide ($SiO_2$).

Figure 1F:
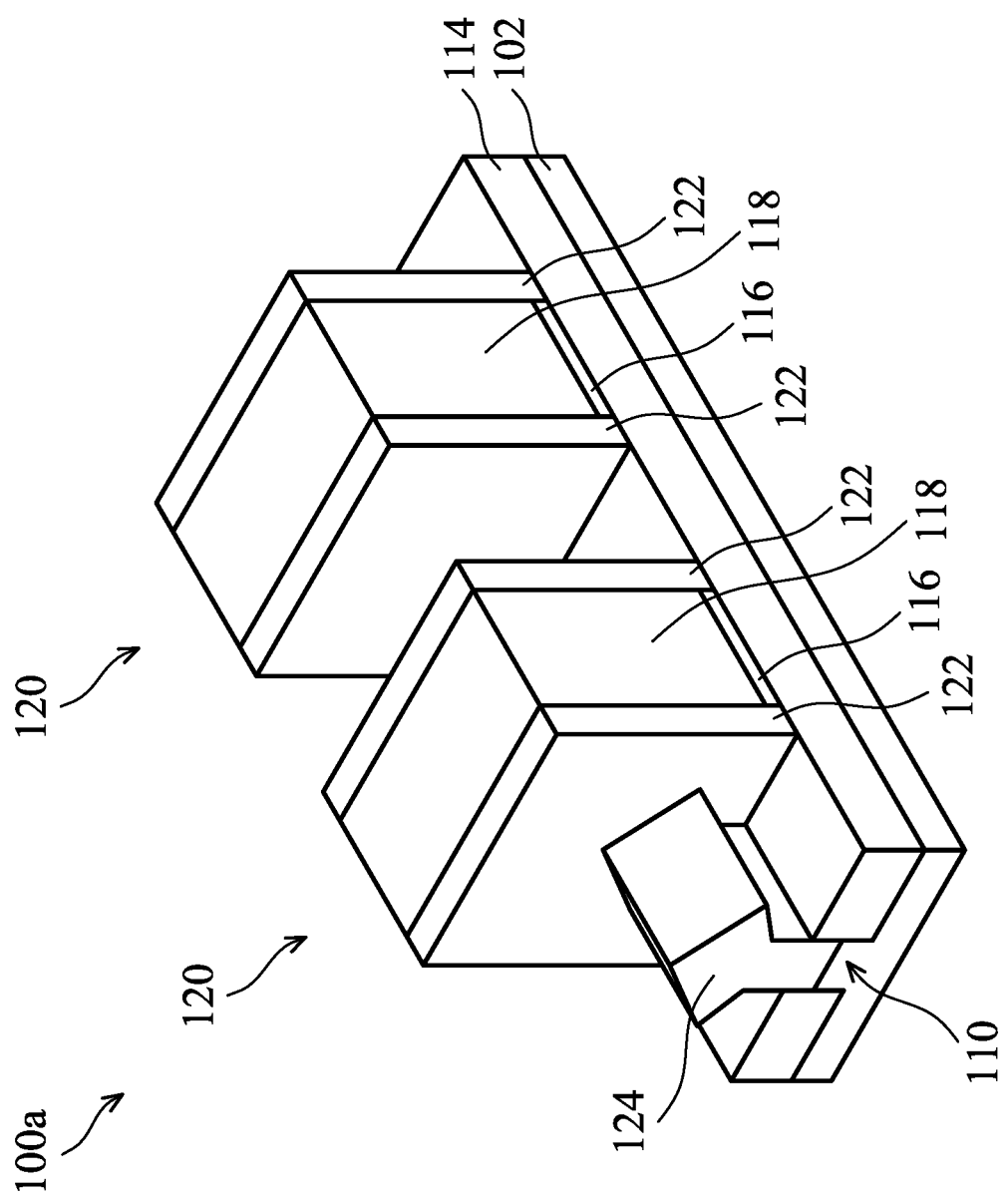

Afterwards, as shown in FIG. 1F, the source/drain (S/D) structures 124 are formed over the fin structure 110, in accordance with some embodiments. In some embodiments, portions of the fin structure 110 adjacent to the dummy gate structure 120 are recessed to form recesses at two sides of the fin structure 110, and a strained material is grown in the recesses by an epitaxial (epi) process to form the S/D structures 124. In addition, the lattice constant of the strained material may be different from the lattice constant of the substrate 102. In some embodiments, the S/D structures 124 include Ge, SiGe, InAs, InGaAs, InSb, GaAs, GaSb, InAlP, InP, or the like.

Figure 1G:
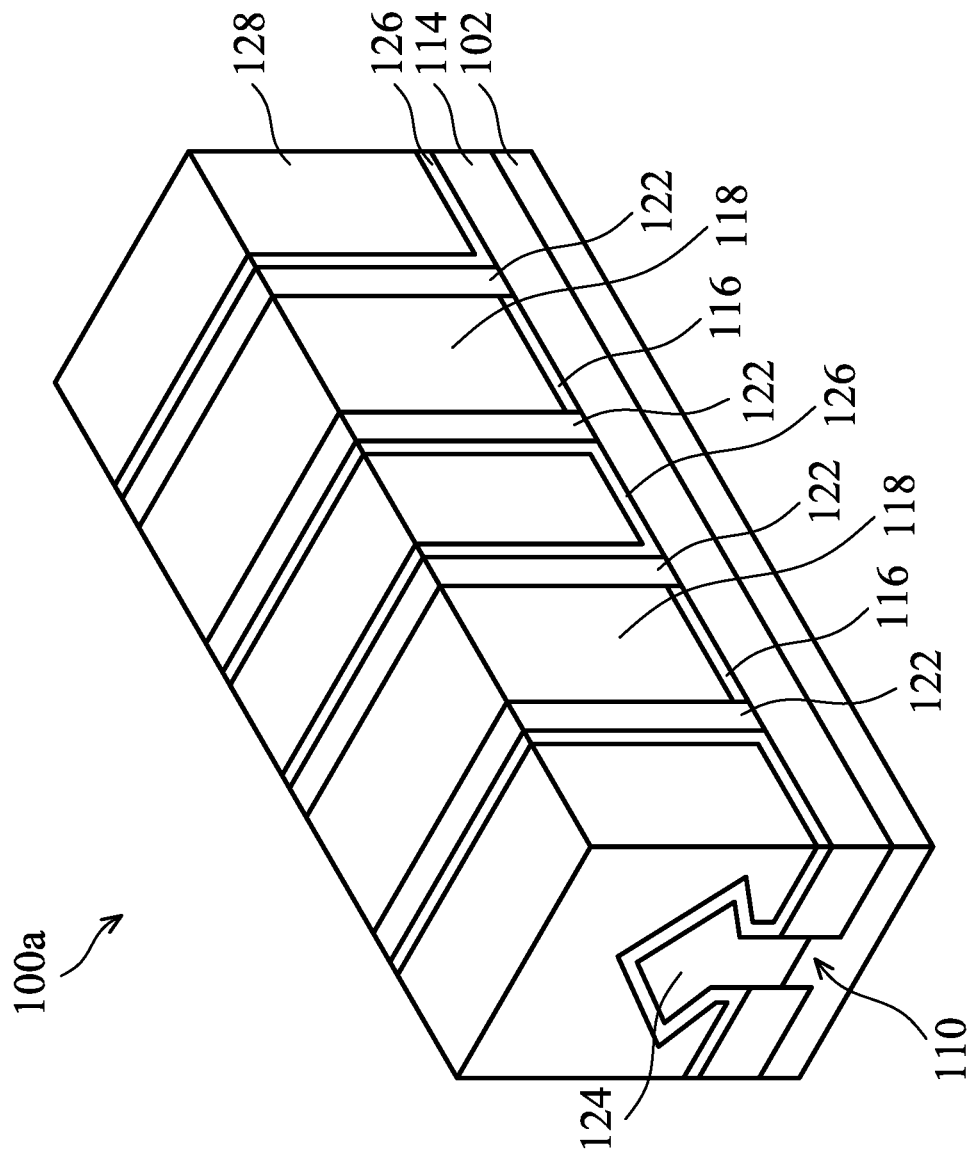

Afterwards, as shown in FIG. 1G, a contact etch stop layer (CESL) 126 is formed over the substrate 102, and an inter-layer dielectric (ILD) layer 128 is formed over the CESL 126, in accordance with some embodiments. In some other embodiments, the CESL 126 is made of silicon nitride, silicon oxynitride, and/or other applicable materials. The CESL 126 may be formed by plasma enhanced CVD, low-pressure CVD, ALD, or other applicable processes.

The ILD layer 128 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 128 may be formed by chemical vapor deposition (CVD), physical vapor deposition, (PVD), atomic layer deposition (ALD), spin-on coating, or another applicable process.

Afterwards, a polishing process is performed on the ILD layer 128 until the top surface of the dummy gate structure 120 is exposed. In some embodiments, the ILD layer 128 is planarized by a chemical mechanical polishing (CMP) process.

Figure 1H:
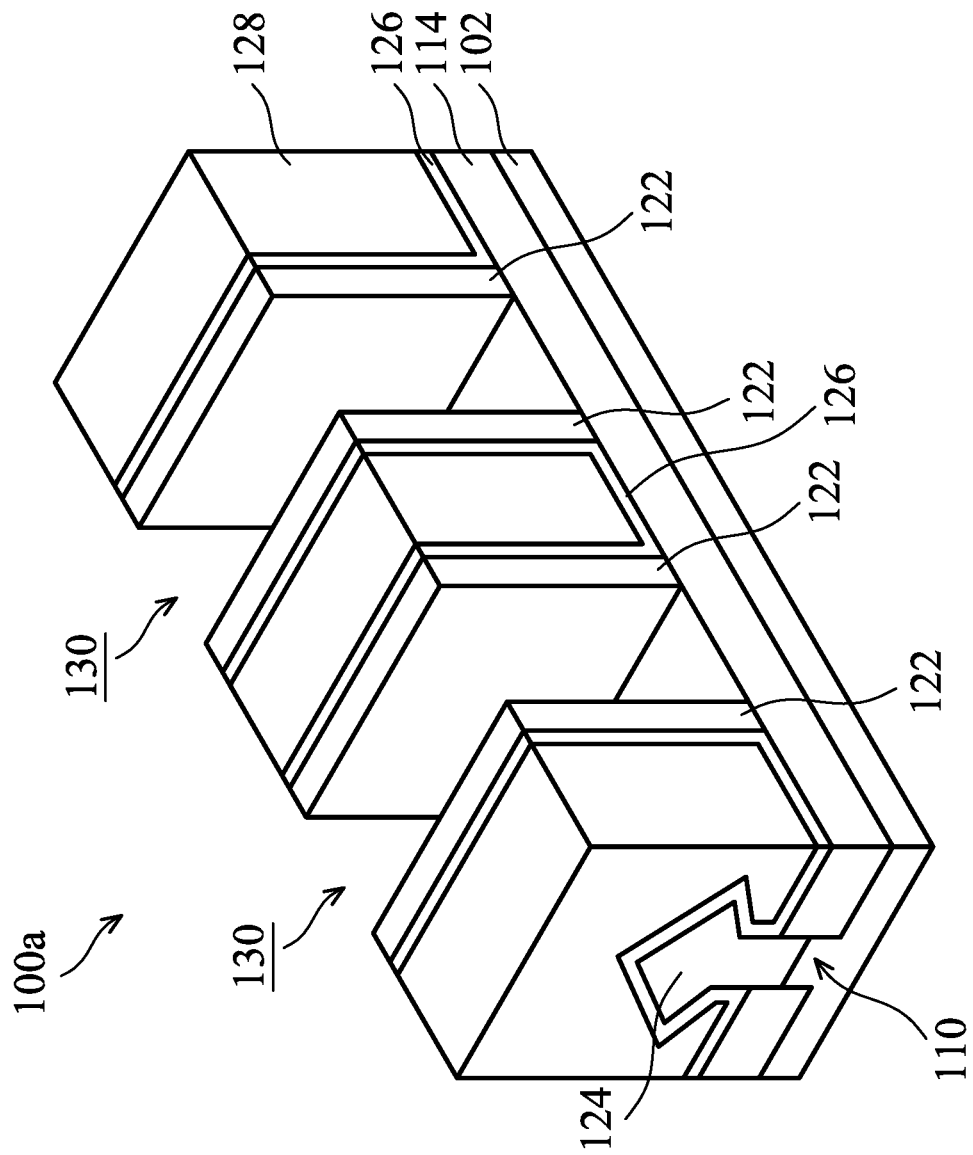

Afterwards, as shown in FIG. 1H, the dummy gate structure 120 is removed to form a trench 130 in the ILD layer 128, in accordance with some embodiments. The dummy gate dielectric layer 116 and the dummy gate electrode layer 118 are removed by an etching process, such as a dry etching process or a wet etching process.

Figure 1I:
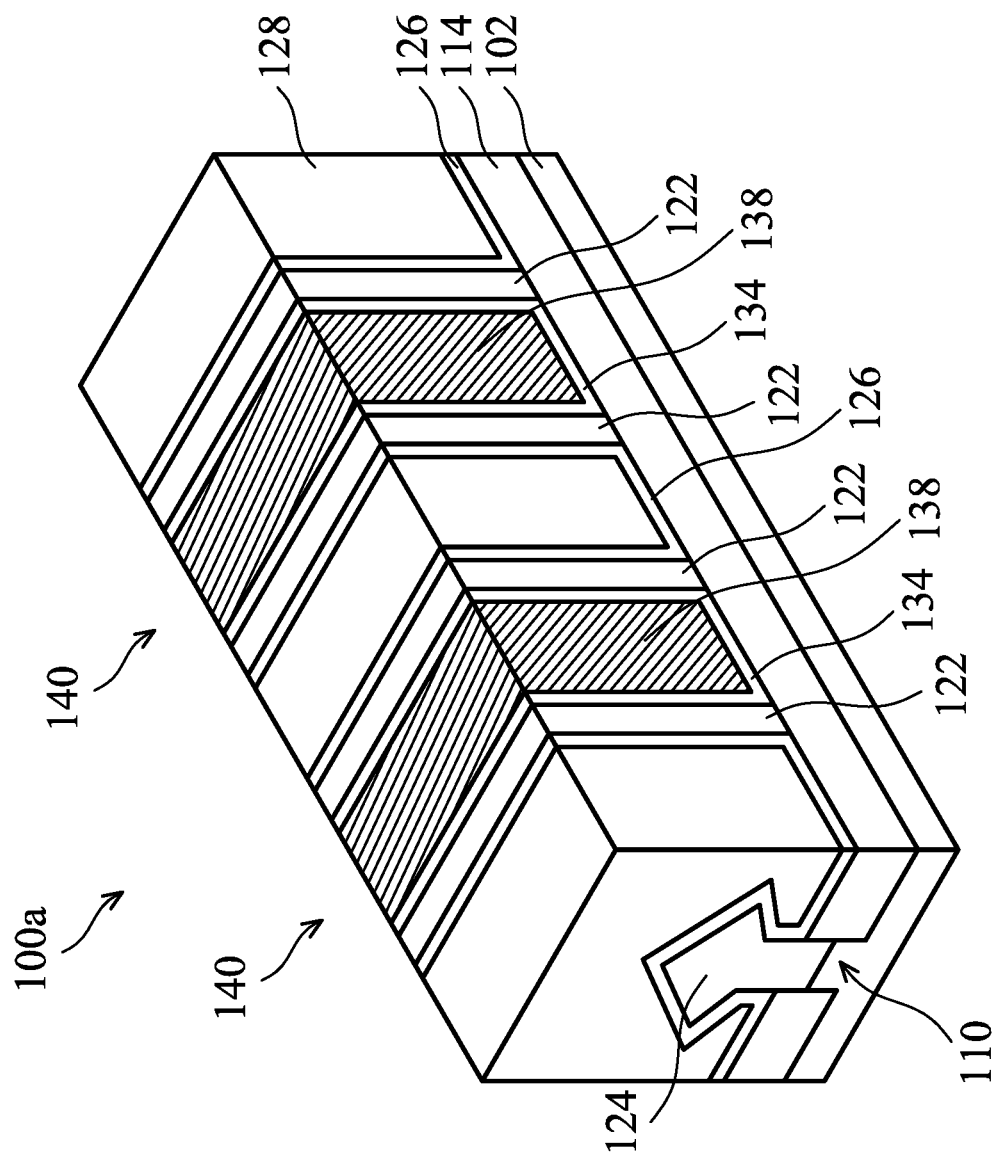

Next, as shown in FIG. 1I, a gate structure 140 is formed in the trench 130, in accordance with some embodiments. The gate structure 140 includes a gate dielectric layer 134 and a gate electrode layer 138.

The gate dielectric layer 134 may be a single layer or multiple layers. The gate dielectric layer 134 is made of silicon oxide (SiOx), silicon nitride (SixNy), silicon oxynitride (SiON), dielectric material(s) with high dielectric constant (high-k), or a combination thereof. The high dielectric constant (high-k) material may be hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. In some embodiments, the gate dielectric layer 134 is deposited by a plasma enhanced chemical vapor deposition (PECVD) process or by a spin coating process.

The gate electrode layer 138 is made of conductive material, such as aluminum (Al), copper (Cu), tungsten (W), titanium (Ti), tantalum (Ta), or other applicable materials.

In some embodiments, the gate structure 140 further includes a work function layer. The work function layer is made of metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof.

The gate electrode layer 138 is formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

Figure 1J:
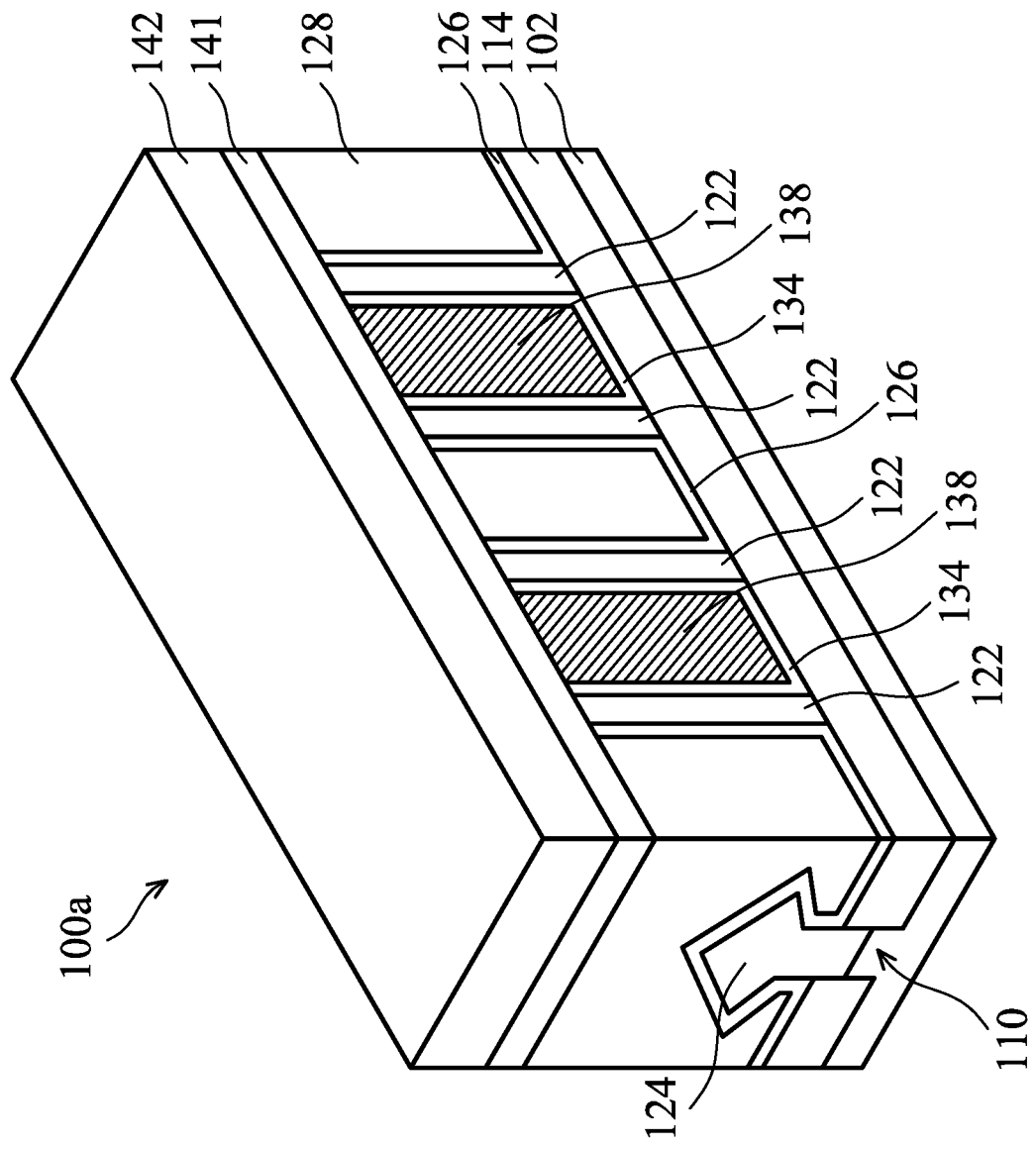

Next, as shown in FIG. 1J, a first etching stop layer 141 is formed over the gate structure 140 and over the ILD layer 128, and a first dielectric layer 142 is formed over the first etching stop layer 141, in accordance with some embodiments.

The first etching stop layer 141 is made of silicon oxide (SiOx), silicon carbide (SiC), silicon nitride (SixNy), silicon carbonitride (SiCN), silicon oxycarbide (SiOC), silicon oxycarbon nitride (SiOCN), or another applicable material. In some embodiments, the first etching stop layer 141 is formed by performing a deposition process, such as an atomic layer deposition (ALD) process, a chemical vapor deposition (CVD) process, a physical vapor deposition (PVD) process, or another applicable process.

The first dielectric layer 142 may be a single layer or multiple layers. The first dielectric layer 142 is made of silicon oxide (SiOx), silicon nitride (SixNy), silicon oxynitride (SiON), dielectric material(s) with low dielectric constant (low-k), or combinations thereof. In some embodiments, the first dielectric layer 142 is made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), or porous silicon oxide ($SiO_2$). In some embodiments, the first dielectric layer 142 is deposited by a plasma enhanced chemical vapor deposition (PECVD) process or by a spin coating process.

Figure 1K:
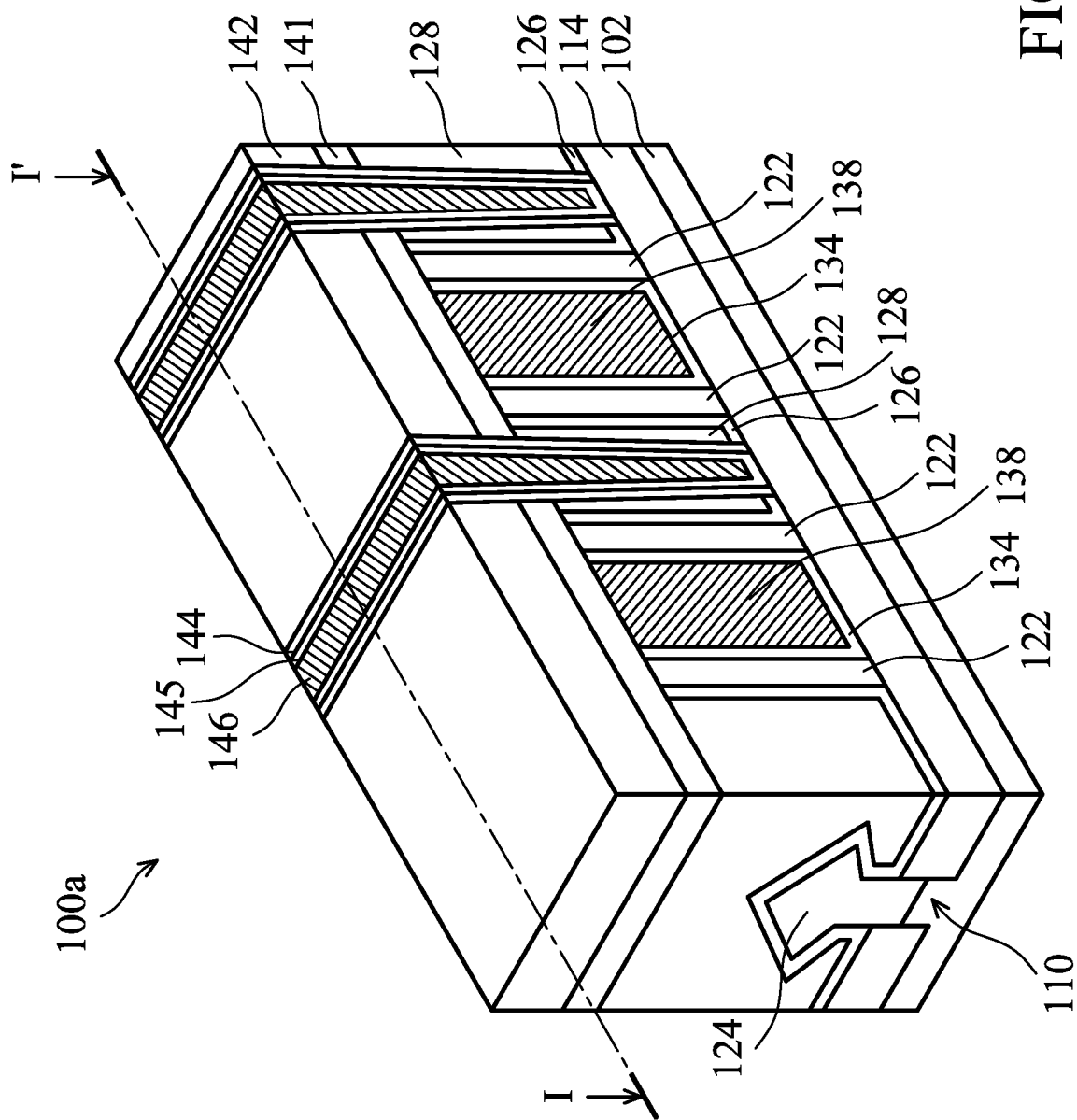

Afterwards, as shown in FIG. 1K, a portion of the first dielectric layer 142, a portion of the first etching stop layer 141, a portion of the ILD layer 128 are removed to form a trench (not shown), in accordance with some embodiments. Subsequently, an insulating layer 144 and a barrier layer 145 are sequentially formed in the sidewall surfaces of the trench, and an S/D contact structure 146 is formed on the barrier layer 145. The barrier layer 145 surrounds the S/D contact structure 146, and the first dielectric layer 142 surrounds the barrier layer 145.

In some embodiments, the insulating layer 144 includes silicon nitride, silicon oxynitride or another applicable material. In some embodiments, the barrier layer 145 includes tantalum (Ta), tantalum nitride (TaN), titanium (Ti), titanium nitride (TiN), cobalt tungsten (CoW) or another applicable material. In some embodiments, the insulating layer 144 and the barrier layer 145 are independently formed by a deposition process, such as a chemical vapor deposition (CVD) process, a sputtering process, or another applicable process.

After the S/D contact structure 146 is formed, a polishing process is performed on the barrier layer 145 and the S/D contact structure 146, until the top surface of the first dielectric layer 142 is exposed. In some embodiments, the polishing process is chemical mechanical polishing (CMP) process. The S/D contact structure 146 is electrically connected to the S/D structure 124. A top surface of the S/D contact structure 146 is higher than a top surface of the gate structure 140.

After the polishing process, the FinFET device structure 100a of FIG. 1K is removed from the one chamber and brought to another chamber to proceed with another process. Before undergoing another process, the FinFET device structure 100a of FIG. 1K is temporarily stored in a box, such as FOUP. Although the FinFET device structure 100a of FIG. 1K is stored in a box, the moisture, such as water vapor ($H_2O$), in the box may react with the exposed top surface of the S/D contact structure 146. As a result, a portion of the S/D contact structure 146 is lost. It should be noted that, in order to protect the exposed top surface of the S/D contact structure 146, the protection layer 150 is formed to cover the top surface of the S/D contact structure 146. In addition, by forming the protection layer 150, the queue time (q-time) (waiting time before moving to another chamber) is not a concern.

Figure 1L:
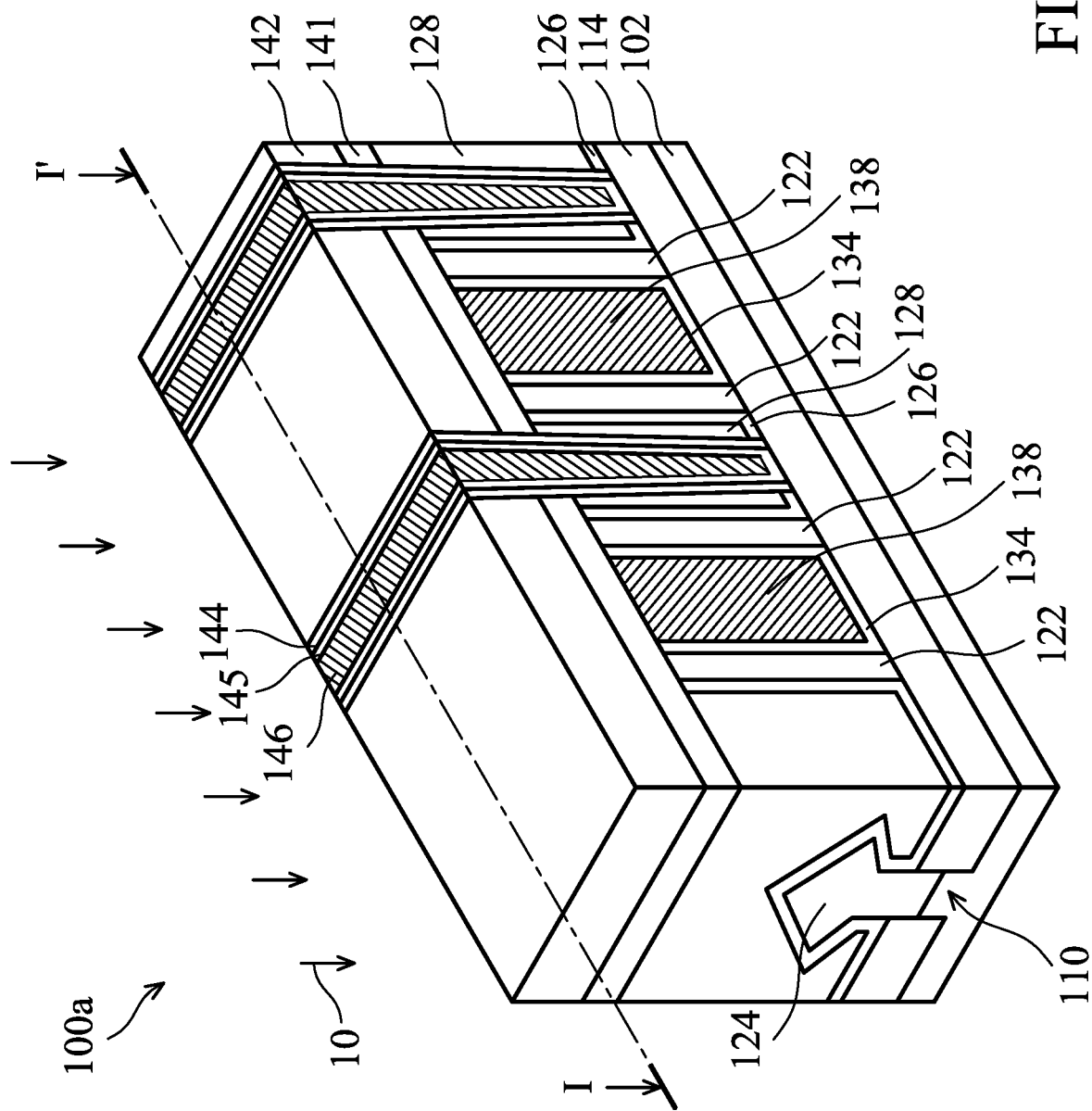

Afterwards, as shown in FIG. 1L, a surface treatment process 10 is performed on the top surface of the S/D contact structure 146, in accordance with some embodiments. The surface treatment process 10 is used to activate the top surface of the S/D contact structure 146. In some embodiments, the surface treatment process 10 includes using hydrogen ($H_2$) gas. When hydrogen ($H_2$) gas is used, hydrogen radicals are formed on the top surface of the S/D contact structure 146. The hydrogen radicals are selectively formed on the top surface of the S/D contact structure 146 to facilitate the formation of the protection layer 150 (shown in FIG. 1M).

Figure 1M:
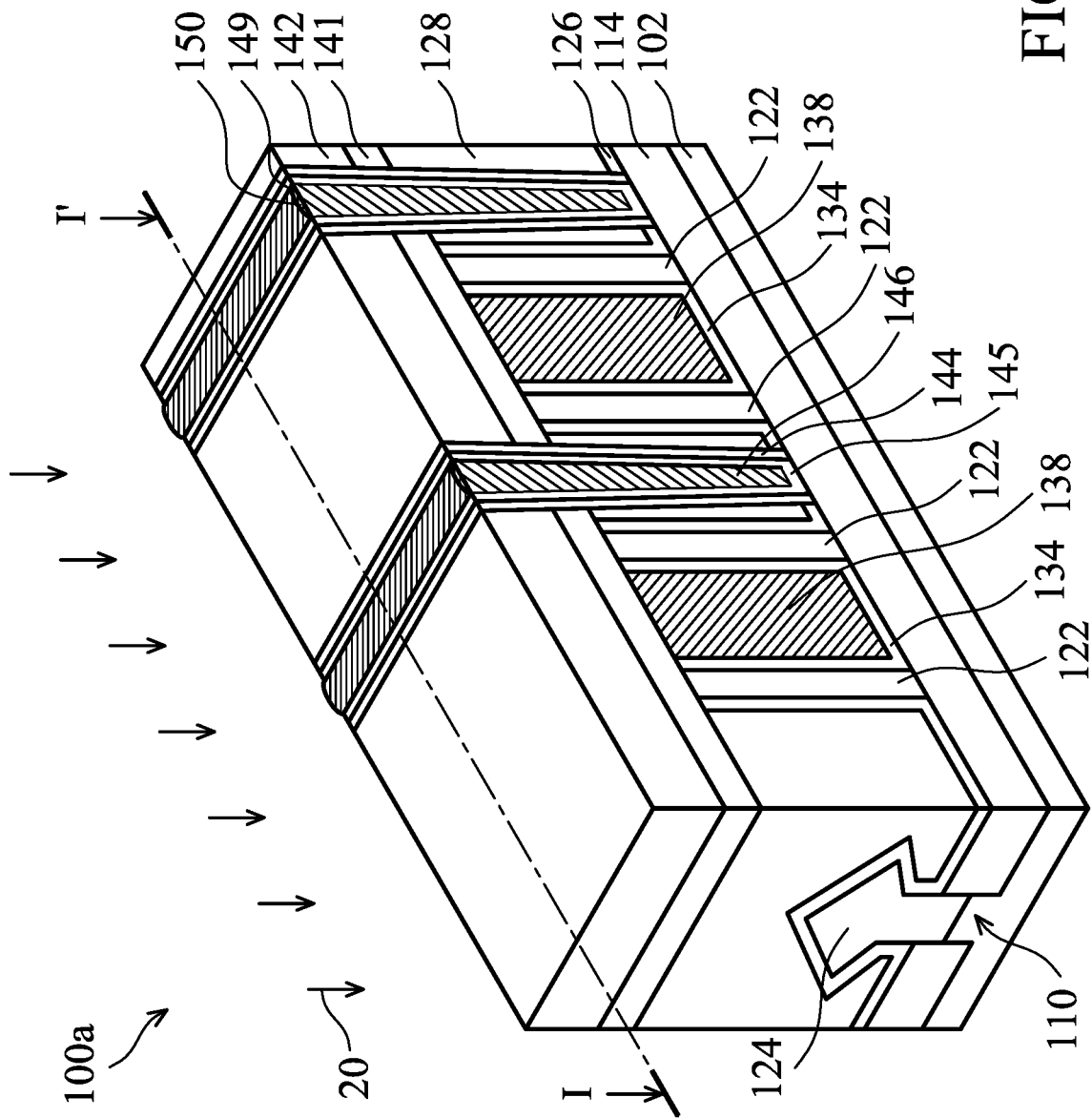

Afterwards, as shown in FIG. 1M, a deposition process 20 is performed to form a protection layer 150 over the S/D contact structure 146, in accordance with some embodiments. The top surface of the S/D contact structure 146 is completely or fully covered by the protection layer 150. The protection layer 150 protrudes upwardly from the top surface of the first dielectric layer 142. In other words, the top surface of the protection layer 150 is higher than the top surface of the first dielectric layer 142. In some embodiments, since the protection layer 150 is made of a conductive material, the protection layer 150 is also referred to as a conductive layer. In some embodiments, the protection layer 150 and the S/D contact structure 146 are made of different materials. In some embodiments, the protection layer 150 is made of tungsten (W), and the S/D contact structure 146 is made of cobalt (Co).

The protection layer 150 is a conductive layer, and is electrically connected to the S/D contact structure 146. The protection layer 150 is used to protect the underlying layers from being polluted. The S/D contact structure 146 is protected from being negatively affected when subsequent processes are performed. In some embodiments, the outer sidewall surface of the protection layer 150 is substantially aligned with the outer sidewall surface of the S/D contact structure 146. In other words, the outer sidewall surface of the protection layer 150 is substantially aligned with the inner sidewall surface of the barrier layer 145.

In some embodiments, the deposition process 20 includes supplying a precursor on the top surface of the S/D contact structure 146. The precursor may include tungsten (W)-containing material, such as tungsten hexafluoride ($WF_6$) or tungsten hexachloride ($WCl_6$). The precursor reacts with the hydrogen radicals to form the protection layer 150 on the S/D contact structure 146. In some embodiments, the S/D contact structure 146 is made of cobalt (Co), and the protection layer 150 is made of tungsten (W). Since the S/D contact structure 146 and the protection layer 150 are made of different materials, there is an interface 149 between S/D contact structure 146 and the protection layer 150. In some embodiments, the interface is substantially level with the top surface of the first dielectric layer 142.

In some embodiments, the protection layer 150 is formed on the top surface of the S/D contact structure 146, but not formed on the top surface of the barrier layer 145. It should be noted that when the protection layer 150 is selectively formed on the S/D contact structure 146 by the surface treatment process 10 and the deposition process 20, the S/D contact structure 146 is protected by the protection layer 150. In some other embodiments, when the S/D contact structure 146 is made of cobalt (Co) and the top surface of the S/D contact structure 146 is exposed, the moisture (such as water vapor) may easily react with the S/D contact structure 146. As a result, the S/D contact structure 146 may easily be etched or removed, to further degrade the performance of the FinFET device structure 100a. In order to protect the S/D contact structure 146, the top surface of the S/D contact structure 146 is covered by the protection layer 150.

Furthermore, since the protection layer 150 is selectively formed on the S/D contact structure 146, no additional mask layer is used to define the location of the protection layer 150. The protection layer 150 is not formed by the photolithography process. Therefore, the fabrication time and cost are reduced.

Figure 1N:
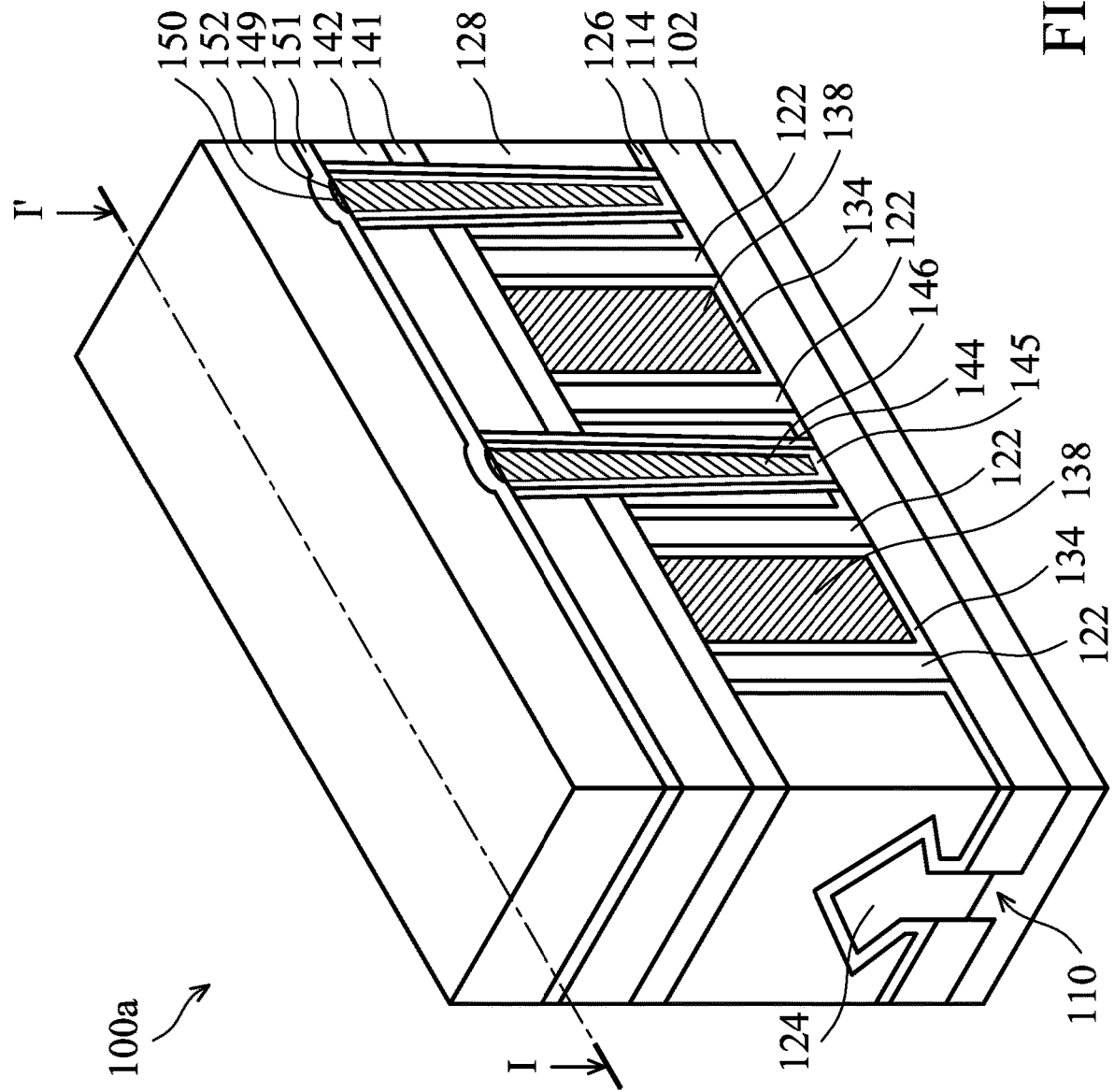

Afterwards, as shown in FIG. 1N, a second etching stop layer 151 is formed on the protection layer 150, and a second dielectric layer 152 is formed on the second etching stop layer 151, in accordance with some embodiments. Since the protection layer 150 protrudes upwardly from the top surface of the first dielectric layer 142, a first portion of the second etching stop layer 151 directly formed on the protection layer 150 is higher than a second portion of the second etching stop layer 151 directly formed on the second dielectric layer 142.

Figure 1O:
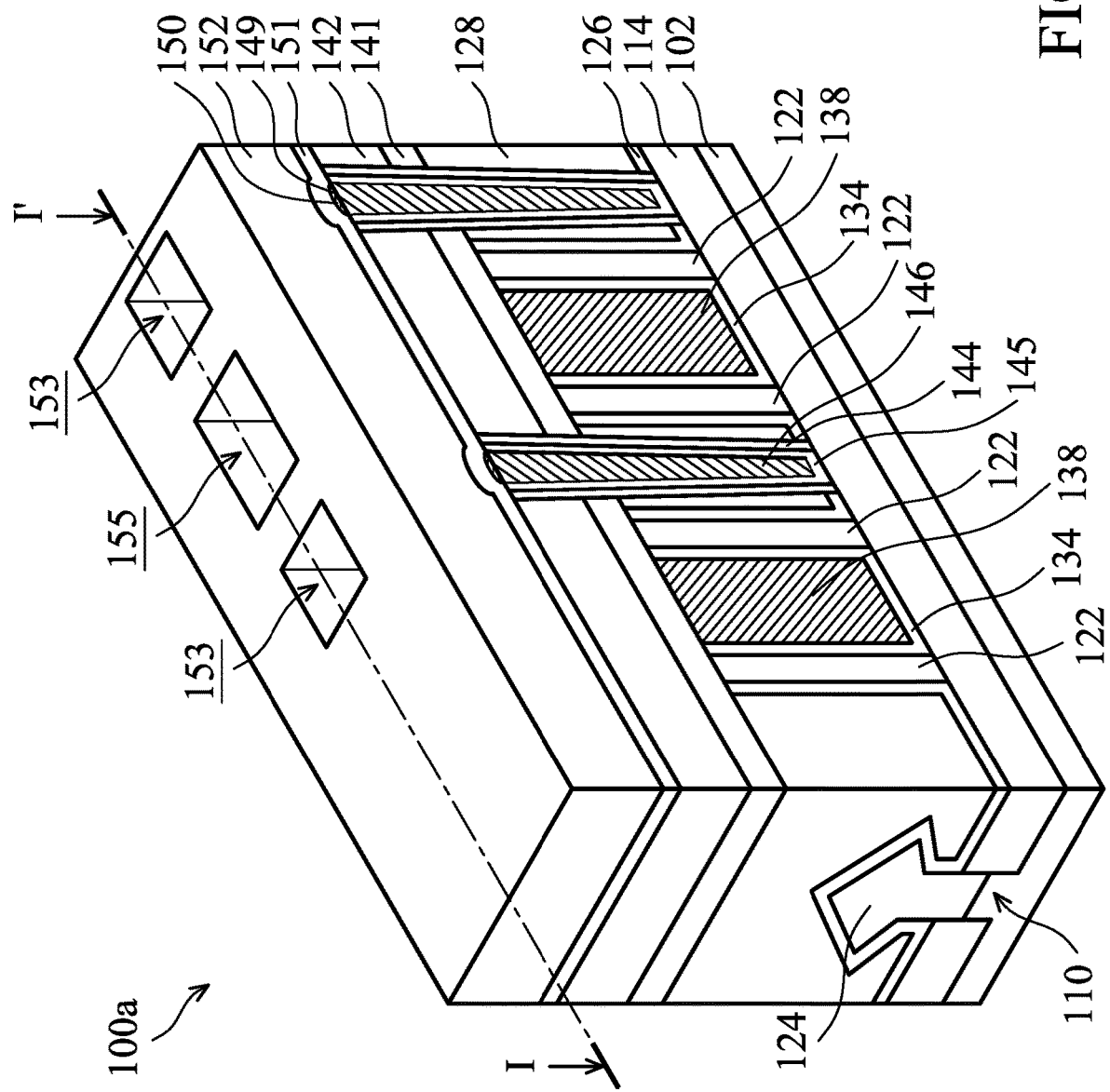
Figure 1P:
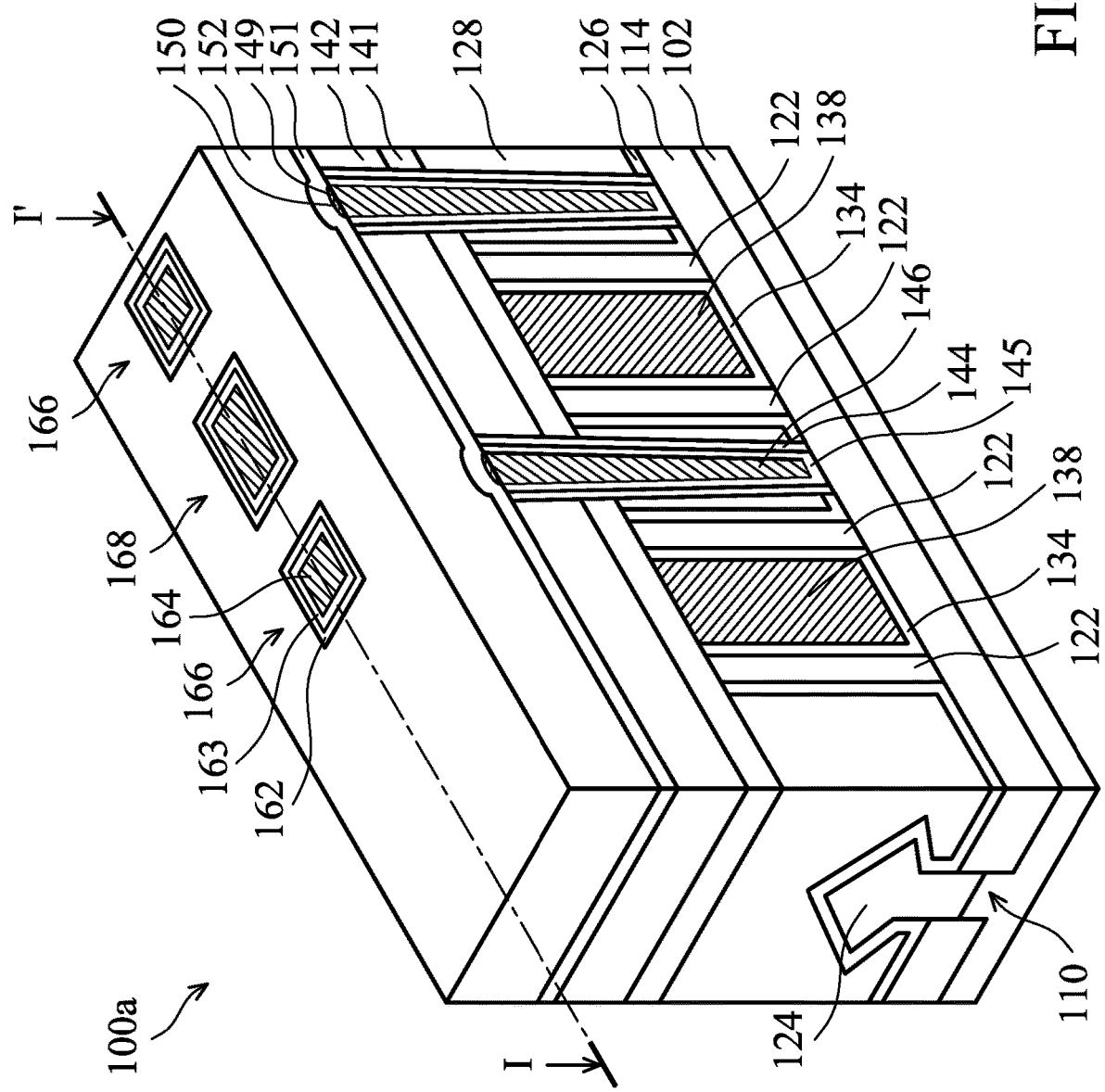

Afterwards, as shown in FIG. 1O, a portion of the second dielectric layer 152 and a portion of the second etching stop layer 151 are removed to form a first recess 153 above the S/D contact structure 146, in accordance with some embodiments. In addition, a portion of the second dielectric layer 152, a portion of the second etching stop layer 151 and a portion of the first dielectric layer 142 and a portion of the first etching stop layer 141 are removed to form a second recess 155 above the gate structure 140. The top surface of the protection layer 150 is exposed by the first recess 153, and the top surface of the gate structure 140 is exposed by the second recess 153. In some embodiments, the first recess 153 and the second recess 155 are formed by an etching process.

Since the S/D contact structure 146 is protected by the protection layer 150, the S/D contact structure 146 is not damaged by an etchant during performing the etching process for forming the first recess 153 and the second recess 155.

Afterwards, as shown in FIG. 1P, an insulating layer 162 and a barrier layer 163 is formed in the first recess 153 and the second recess 155, in accordance with some embodiments. Afterwards, a conductive layer 164 is formed over the barrier layer 163. The S/D conductive plug 166 over the S/D contact structure 146 is constructed by the barrier layer 163 and the conductive layer 164, and the gate contact structure 168 over the gate structure 140 is constructed by the barrier layer 163 and the conductive layer 164. Since the S/D conductive plug 166 and the gate contact structure 168 are formed simultaneously, the S/D conductive plug 166 and the gate contact structure 168 both have the same construction.

The S/D conductive plug 166 includes a U-shaped barrier layer 163 and the conductive layer 164, and the U-shaped barrier layer 163 is in direct contact with the protection layer 150. The S/D conductive plug 166 is electrically connected to the S/D contact structure 146 by the protection layer 150, and the S/D contact structure 146 is electrically connected to the S/D structure 124.

In some embodiments, the barrier layer 163 and the protection layer 150 are made of different materials. In some embodiments, the barrier layer 163 is made of tantalum (Ta), tantalum nitride (TaN), titanium (Ti), titanium nitride (TiN), cobalt tungsten (CoW) or another applicable material. In some embodiments, the barrier layer 163 is made of Ti/TiN/W, and tungsten (W) in the barrier layer 163 has a smaller grain size than the grain size of the conductive layer 164 when the conductive layer 164 is made of tungsten (W). In some embodiments, the barrier layer 163 is formed by a deposition process, such as a chemical vapor deposition (CVD) process, physical vapor deposition (PVD) process, atomic layer deposition (ALD) process, plating process or another application process.

In some embodiments, the conductive layer 164 is made of tungsten (W), cobalt (Co), titanium (Ti), aluminum (Al), copper (Cu), tantalum (Ta), platinum (Pt), molybdenum (Mo), silver (Ag), manganese (Mn), zirconium (Zr), ruthenium (Ru), or another application material. In some embodiments, the conductive layer 164 is formed by a deposition process, such as a chemical vapor deposition (CVD) process, physical vapor deposition (PVD) process, atomic layer deposition (ALD) process, plating process or another application process.

Figure 2A:
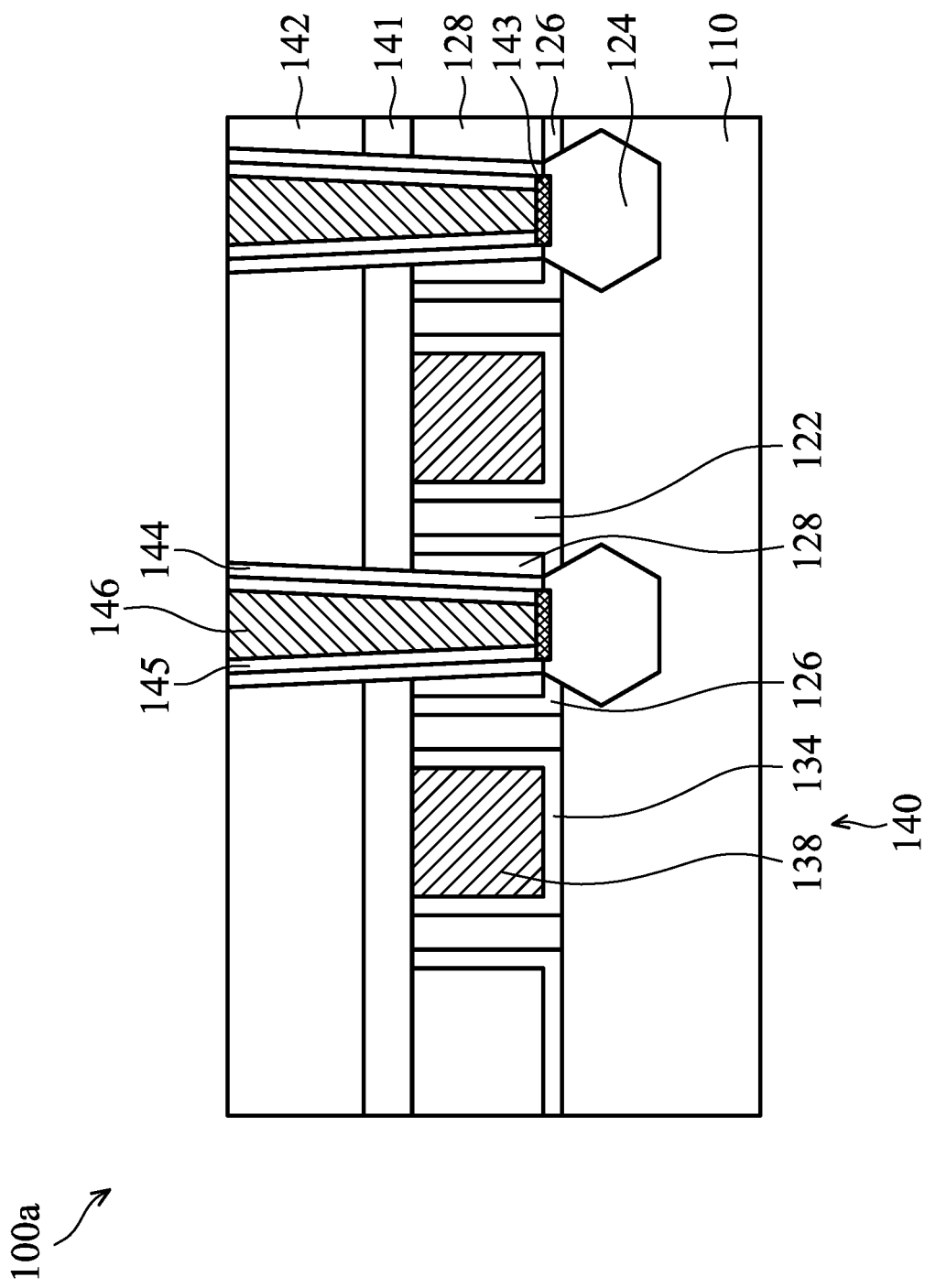
FIGS. 2A-2F show cross-sectional representations of various stages of forming a FinFET device structure after the structure of FIG. 1J, in accordance with some embodiments of the disclosure.

FIGS. 2A-2F show cross-sectional representations of various stages of forming a FinFET device structure 200a after the structure of FIG. 1J, in accordance with some embodiments of the disclosure. FIG. 2A is a cross-sectional representation taken along line I-I' of FIG. 1K. FIGS. 2B-1, 2C-1 and 2C-2 show cross-sectional representations of forming the protection layer 150, in accordance with some embodiments of the disclosure.

As shown in FIG. 2A, a metal silicide layer 143 is formed on the S/D structure 124, and the S/D contact structure 146 is formed on the metal silicide layer 143. More specifically, the metal silicide layer 143 is between the S/D structure 124 and the S/D contact structure 146. The metal silicide layer 143 is used to reduce contact resistance (Rcsd) between the S/D contact structure 146 and the S/D structure 124. In addition, the S/D contact structure 146 is surrounded by the insulating layer 144 and the barrier layer 145.

In some embodiments, a barrier layer 145 is formed over the S/D structure 124, and an annealing process is performed on the metal layer to form the metal silicide layer 143. The barrier layer 145 firstly has U-shaped, and a bottom portion of the barrier layer 145 is reacted with the S/D structure 124 to form the metal silicide layer 143. In some other embodiments, the metal silicide layer 143 is made of titanium silicide (TiSix). In some other embodiments, the metal silicide layer 143 is made of or tantalum silicide (TaSix).

Figure 2B:
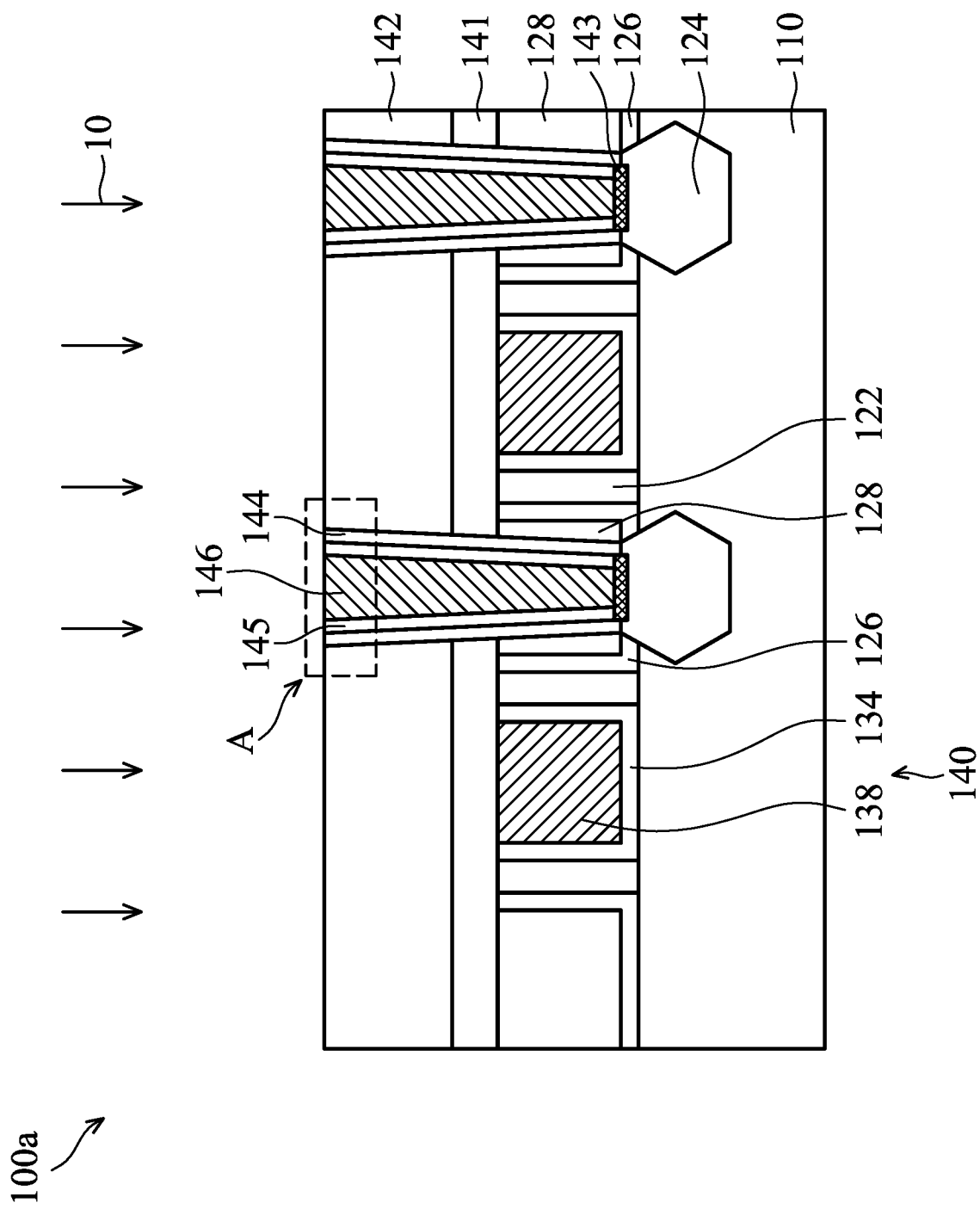
Figures 1, 2B:
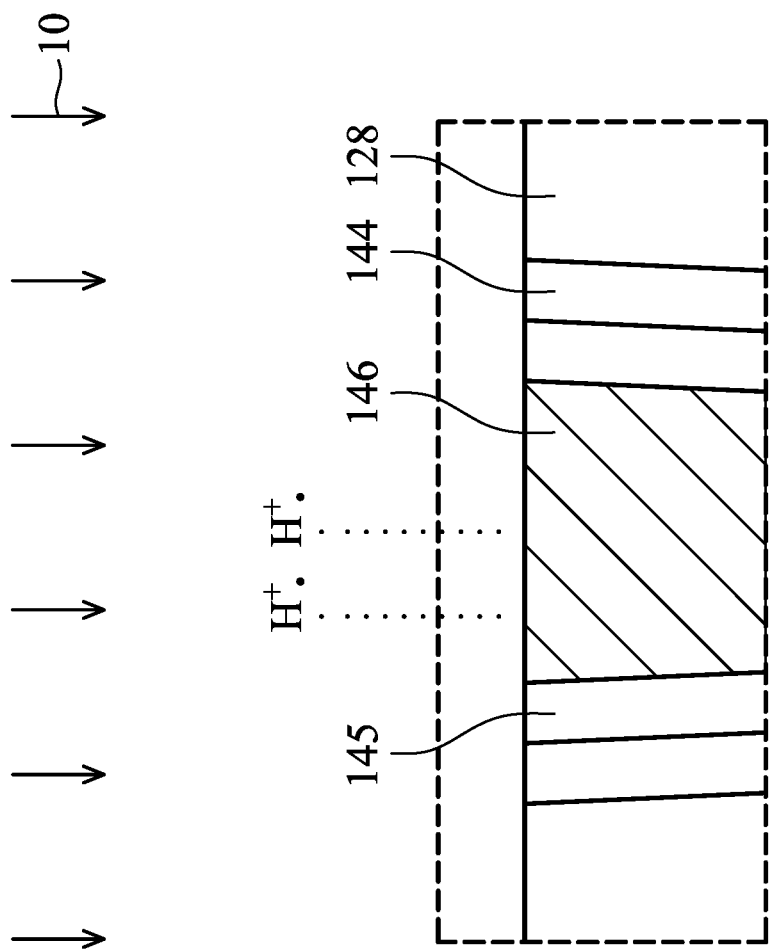

FIG. 2B-1 shows a cross-sectional representation of region A of FIG. 2B.

Afterwards, as shown in FIG. 2B and FIG. 2B-1, the surface treatment process 10 is performed on the top surface of the S/D contact structure 146, in accordance with some embodiments. The surface treatment process 10 is used to activate the top surface of the S/D contact structure 146. As shown in FIG. 2B-1, the surface treatment process 10 may include using hydrogen ($H_2$) gas. When hydrogen ($H_2$) gas is used, the hydrogen radicals are formed on the top surface of the S/D contact structure 146. The hydrogen radicals may be absorbed on the top surface of the S/D contact structure 146. The hydrogen radicals are selectively formed on the top surface of the S/D contact structure 146 to facilitate the formation of the protection layer 150.

Figure 2C:
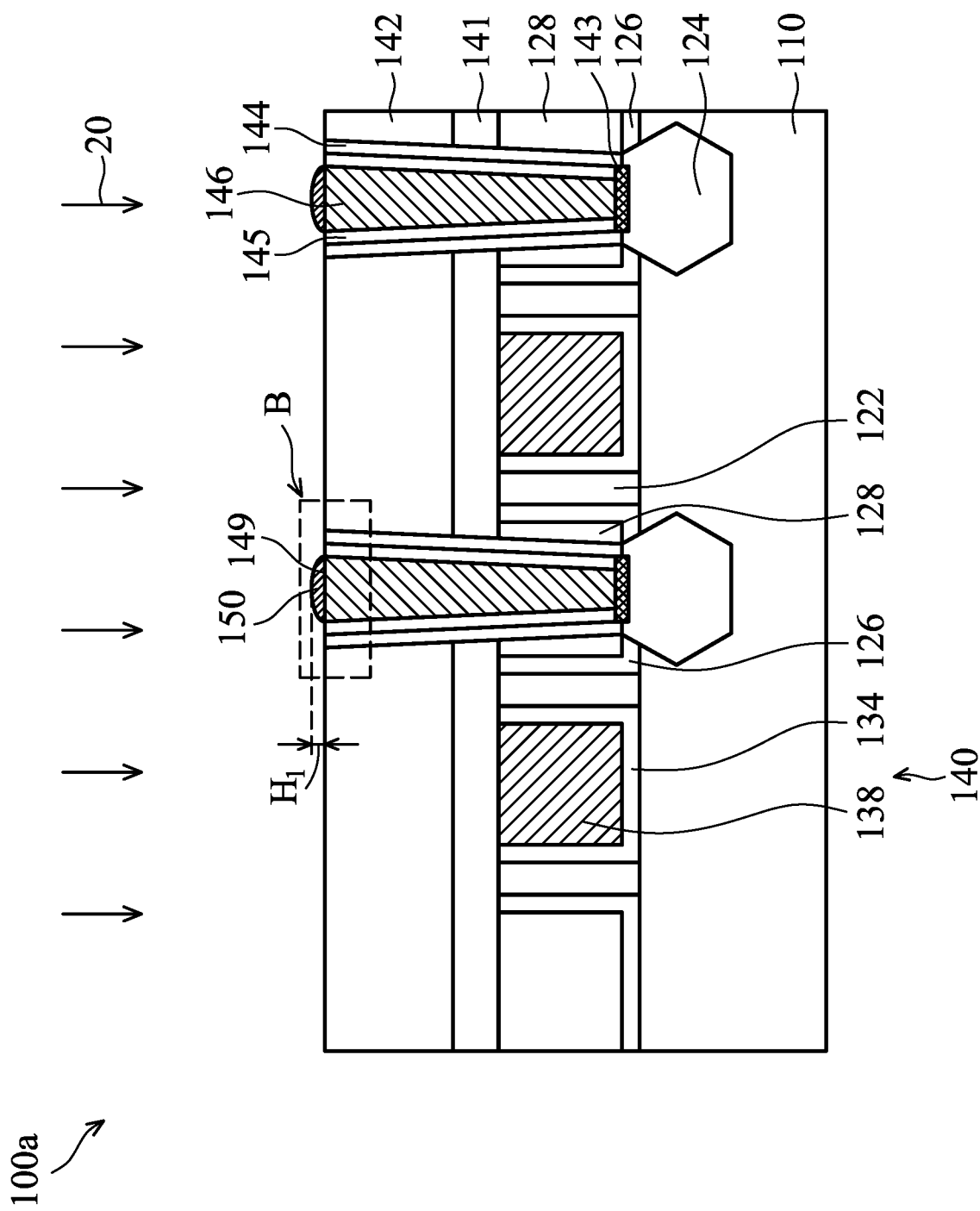
Figures 1, 2C:
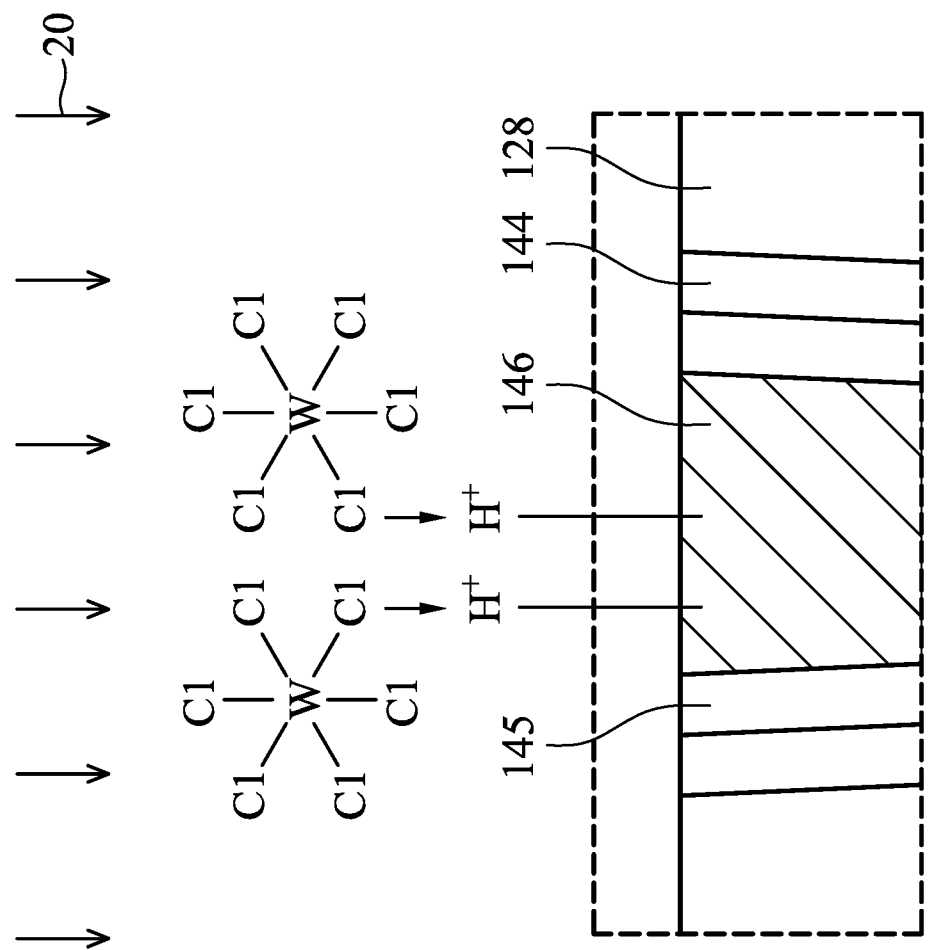
Figures 2, 2C:
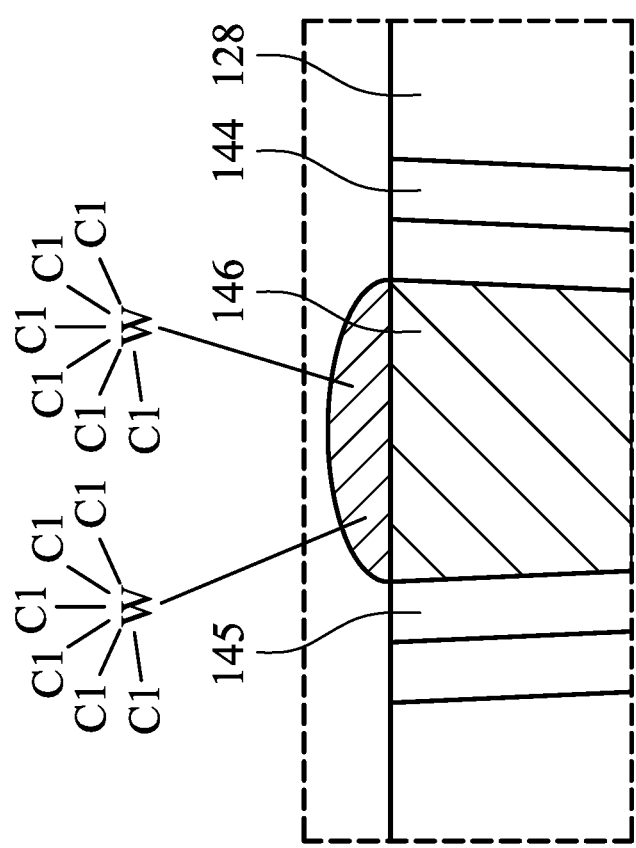

FIGS. 2C-1 and 2C-2 show cross-sectional representations of region B of FIG. 2C. Subsequently, as shown in FIGS. 2C, 2C-1 and 2C-2, the deposition process 20 is performed to form a protection layer 150 over the S/D contact structure 146, in accordance with some embodiments. As shown in FIG. 2C-1, the deposition process 20 includes supplying a precursor on the top surface of the S/D contact structure 146. The precursor may include tungsten (W)-containing material, such as tungsten hexafluoride ($WF_6$) or tungsten hexachloride ($WCl_6$). The precursor reacts with the hydrogen radicals to form the protection layer 150 on the S/D contact structure 146. Therefore, the protection layer 150 as shown in FIG. 2C-2 is selectively formed on the top surface of the S/D contact structure 146, but is not formed on the top surface of the barrier layer 145 and the top surface of the second dielectric layer 142.

The protection layer 150 has a convex shape with a middle portion and an edge portion. The middle portion is higher than the edge portion. The middle portion has a first thickness, the edge portion has a second thickness, and the first thickness is greater than the second thickness. The protection layer 150 has a curved top surface since the protection layer 150 is selectively formed on the S/D contact structure 146. It should be noted that the protection layer 150 is selectively formed on conductive material, but not formed on the barrier layer 145 and the insulating layer 144.

The protection layer 150 protrudes upwardly from the top surface of the barrier layer 145. The protection layer 150 has a first height $H_1$ which is measured from the top surface of the protection layer 150 to the top surface of the first dielectric layer 142. In some embodiments, the first height $H_1$ is in a range from about 5 nm to about 10 nm. If the first height $H_1$ is too high, an unwanted leakage path to another via may be formed through the protection layer 150. If the first height $H_1$ is too low, the protection layer 150 could not effectively protect the S/D contact structure 146. The S/D contact structure 146 has a second height $H_2$ which is measured from the top surface of the S/D contact structure 146 to the top surface of the fin structure 110. In some embodiments, a ratio of the first height $H_1$ to the second height $H_2$ is in a range from about 0.1 to about 0.3.

Figure 2D:
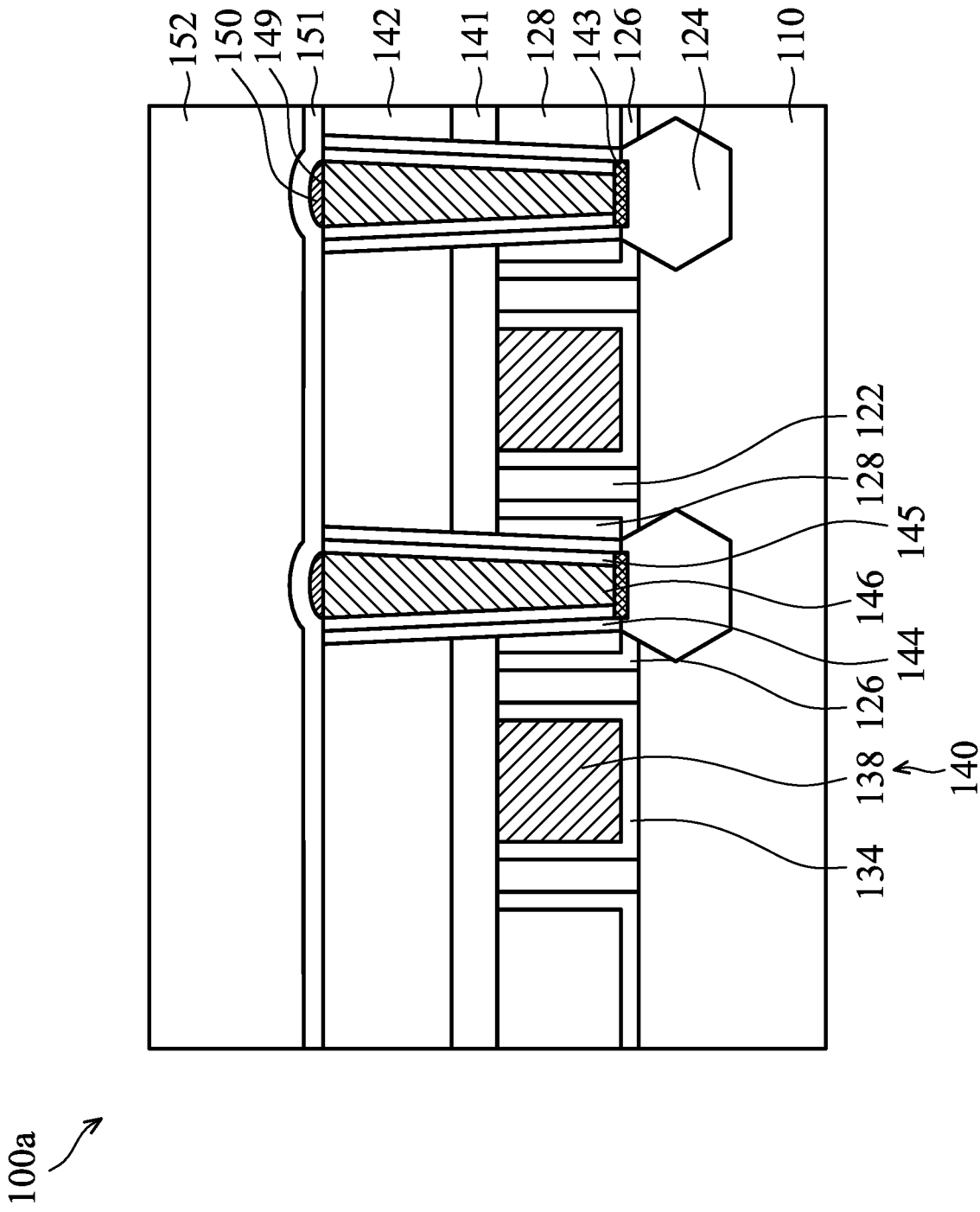

Afterwards, as shown in FIG. 2D, the second etching stop layer 151 is formed on the protection layer 150, and the second dielectric layer 152 is formed on the second etching stop layer 151, in accordance with some embodiments.

Figure 2E:
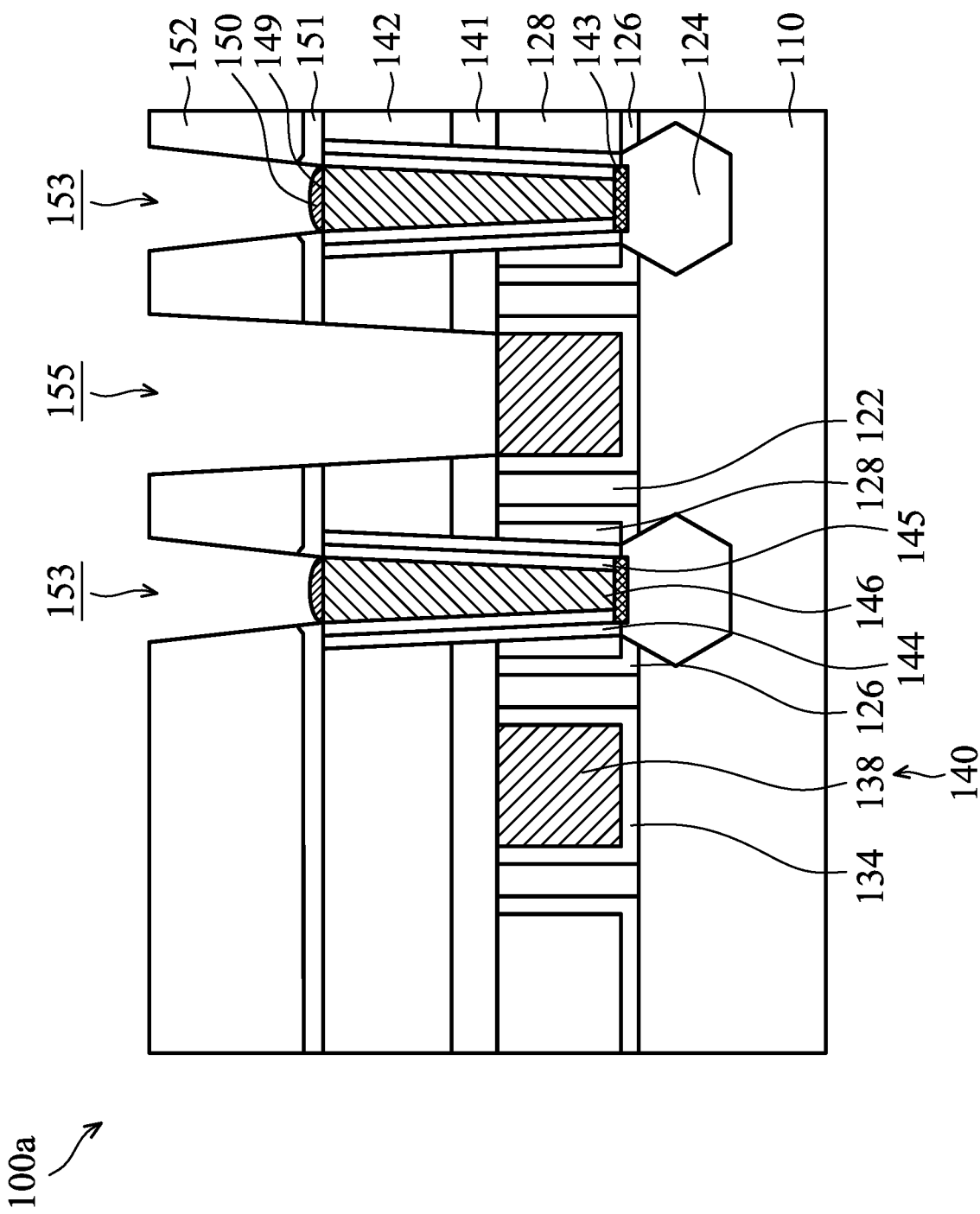

Subsequently, as shown in FIG. 2E, the first recess 153 is formed to expose the top surface of the protection layer 150, and the second recess 155 is formed to expose the top surface of the gate structure 140, in accordance with some embodiments. The top surface of the protection layer 150 is exposed by the first recess 153, and the sidewall surfaces of the protection layer 150 is still covered by the second etching stop layer 151. It should be noted that the S/D contact structure 146 is not exposed by the first recess 153 since the protection layer 150 is directly formed on the S/D contact structure 146. In addition, the first recess 153 and the second recess 155 are simultaneously formed by an etching process. The etching process may include multiple etching operations.

Figure 2F:
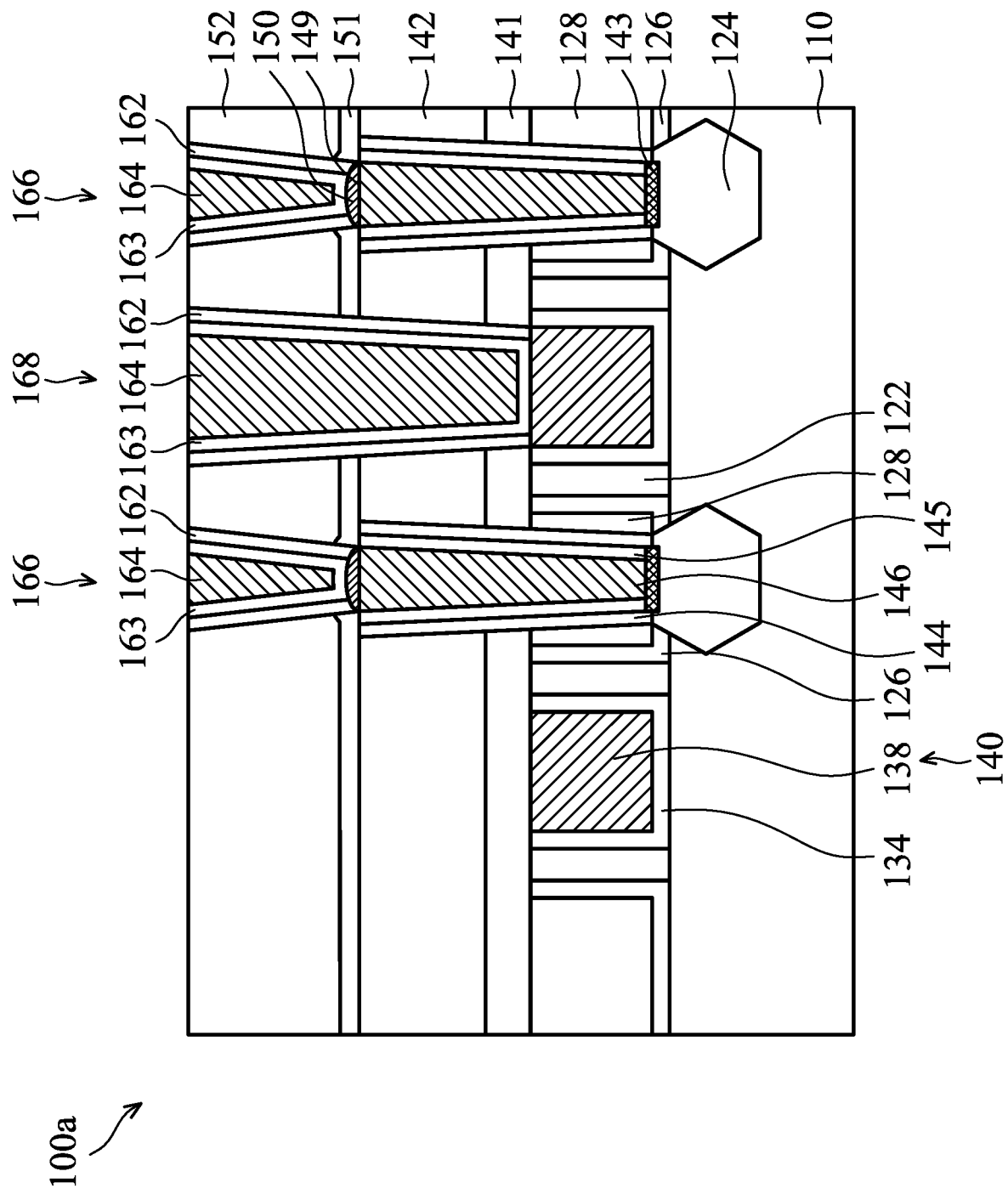

Afterwards, as shown in FIG. 2F, the barrier layer 163 is formed in the first recess 153 and the second recess 155, in accordance with some embodiments. Afterwards, the conductive layer 164 is formed over the barrier layer 163. The S/D conductive plug 166 includes the U-shaped barrier layer 163 and the conductive layer 164, and the gate contact structure 168 includes the U-shaped barrier layer 163 and the conductive layer 164. The top surface of the protection layer 150 is in direct contact with the S/D conductive plug 166, and the sidewall surface of the protection layer 150 is in direct contact with the second etching stop layer 151. The protection layer 150 is embedded in the second etching stop layer 151. The U-shaped barrier layer 163 is in direct contact with a portion of the protection layer 150. The outer sidewall surface of the protection layer 150 is aligned with the outer sidewall surface of the barrier layer 163.

The S/D contact structure 146 is formed by using a deposition process and a polishing process. After the polishing process, the FinFET device structure 100a of FIG. 2A is removed from the one chamber and brought to another chamber to proceed with another process. Before undergoing another process, the FinFET device structure 100a of FIG. 2A is temporarily stored in a box, such as FOUP. Although the FinFET device structure 100a of FIG. 2A is stored in a box, the moisture, such as water vapor ($H_2O$), in the box may react with the exposed top surface of the S/D contact structure 146. As a result, a portion of the S/D contact structure 146 is lost.

It should be noted that, in order to protect the exposed top surface of the S/D contact structure 146, the protection layer 150 is formed to cover the S/D contact structure 146. By forming the protection layer 150, the queue time (q-time) (waiting time before moving to another chamber) is not a concern. In addition, the top surface of the S/D contact structure 146 is covered by the protection layer 150, and therefore the S/D contact structure 146 will not be damaged by the etching etchant which is used for forming the first recess 153 and the second recess 155.

Figure 3:
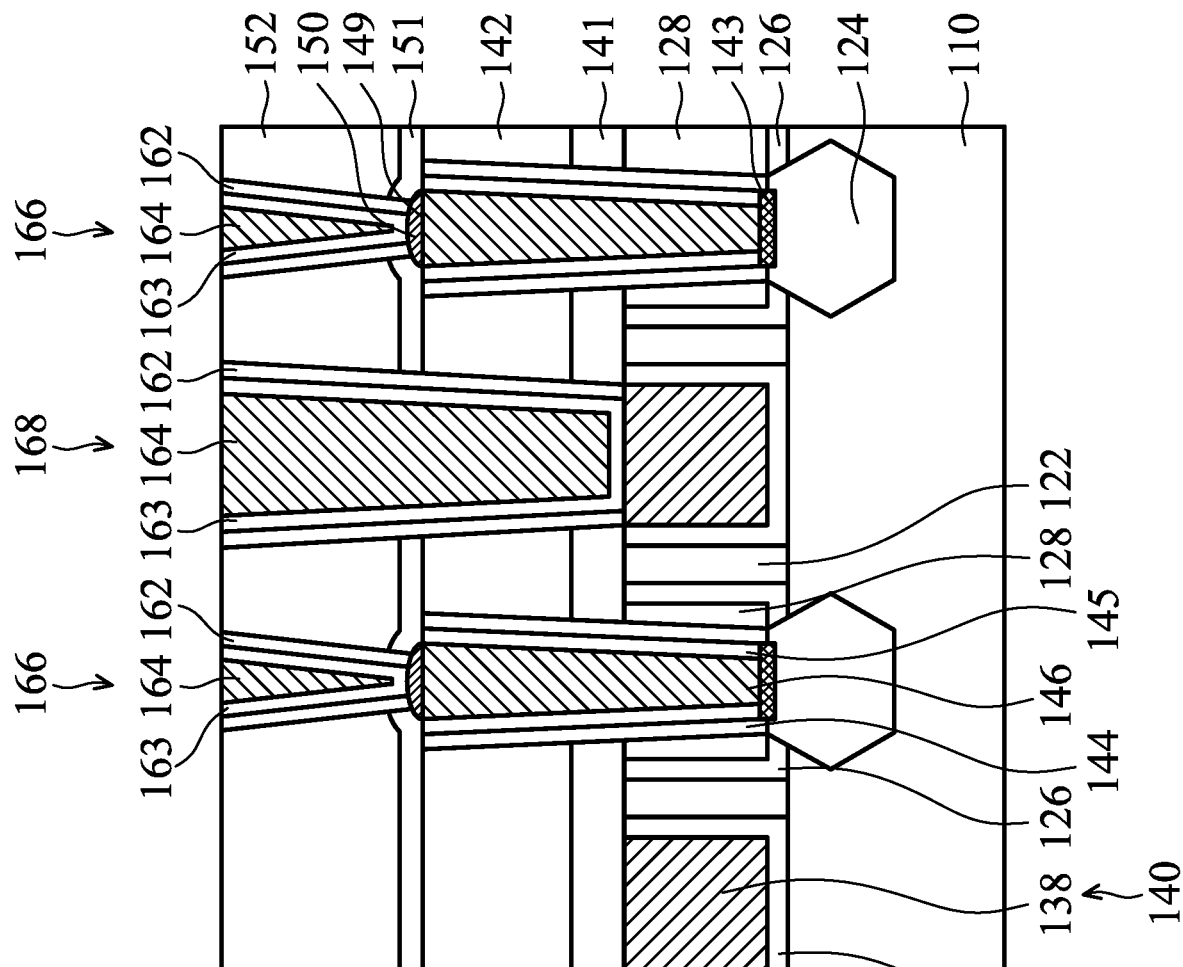
FIG. 3 shows a cross-sectional representation of a modified FinFET device structure, in accordance with some embodiments of the disclosure.

FIG. 3 shows a cross-sectional representation of a modified FinFET device structure 100b, in accordance with some embodiments of the disclosure. The FinFET device structure 100b of FIG. 3 is similar to the FinFET device structure 100a of FIG. 2F, the difference between FIG. 3 and FIG. 2F is that the width of the first recess directly above the protection layer 150 in FIG. 3 is smaller than the width of the first recess 153 in FIG. 2F. Therefore, the outer sidewall surface of the protection layer 150 is not aligned with the outer sidewall surface of the barrier layer 163.

Figure 4:
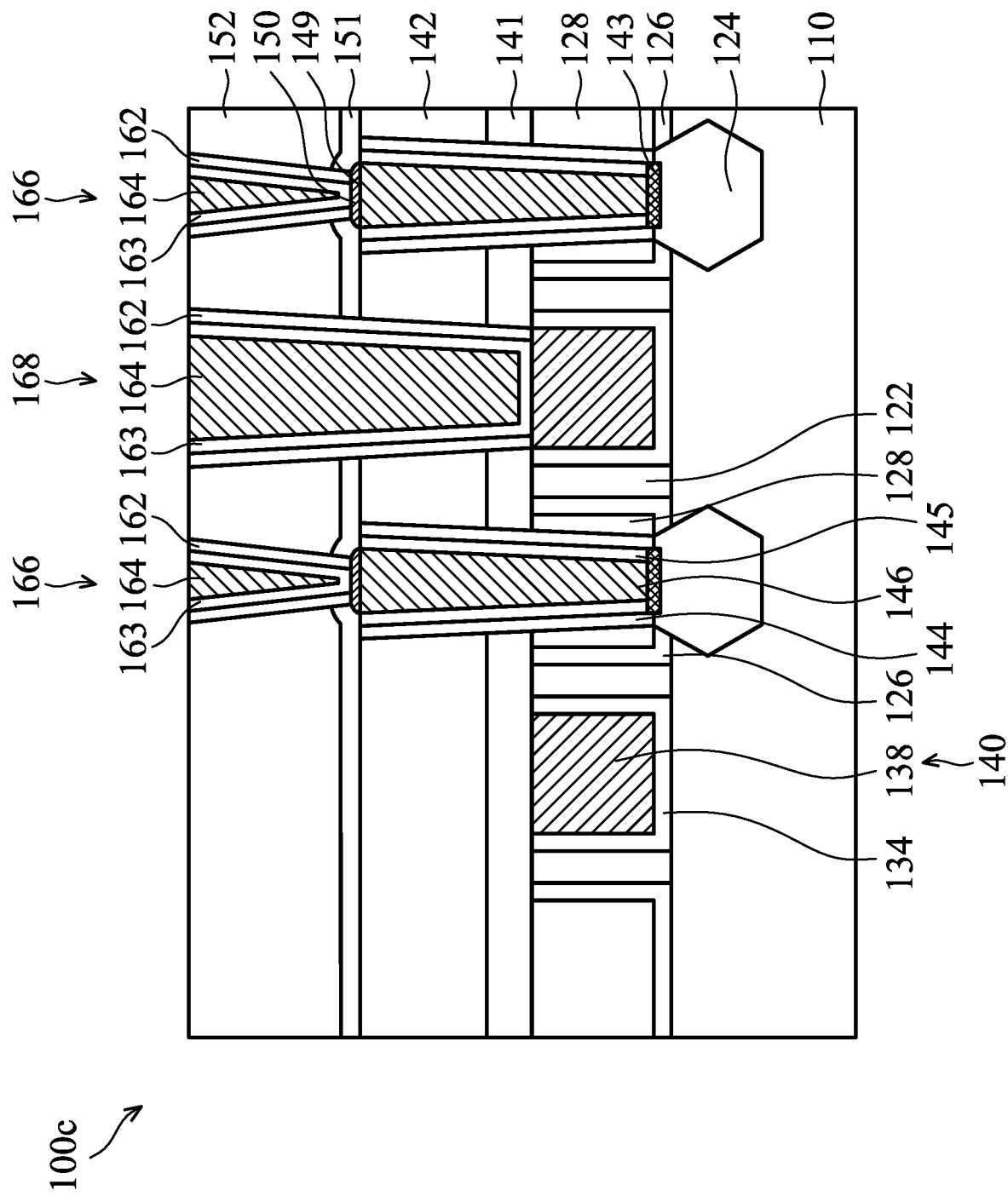
FIG. 4 shows a cross-sectional representation of a modified FinFET device structure, in accordance with some embodiments of the disclosure.

FIG. 4 shows a cross-sectional representation of a modified FinFET device structure 100c, in accordance with some embodiments of the disclosure. The FinFET device structure 100c of FIG. 4 is similar to the FinFET device structure 100a of FIG. 2F, the difference between FIG. 4 and FIG. 2F is that a portion of the protection layer 150 is removed in FIG. 4. During the etching process performed on the second dielectric layer 152 and the second etching stop layer 151, the protection layer 150 may be removed. A portion of the top portion of the protection layer 150 is recessed. As a result, a bottom surface of the S/D conductive plug 166 is lower than the top surface of the protection layer 150. In other words, a portion of the S/D conductive plug 166 is inserted into the protection layer 150.

Figure 5A:
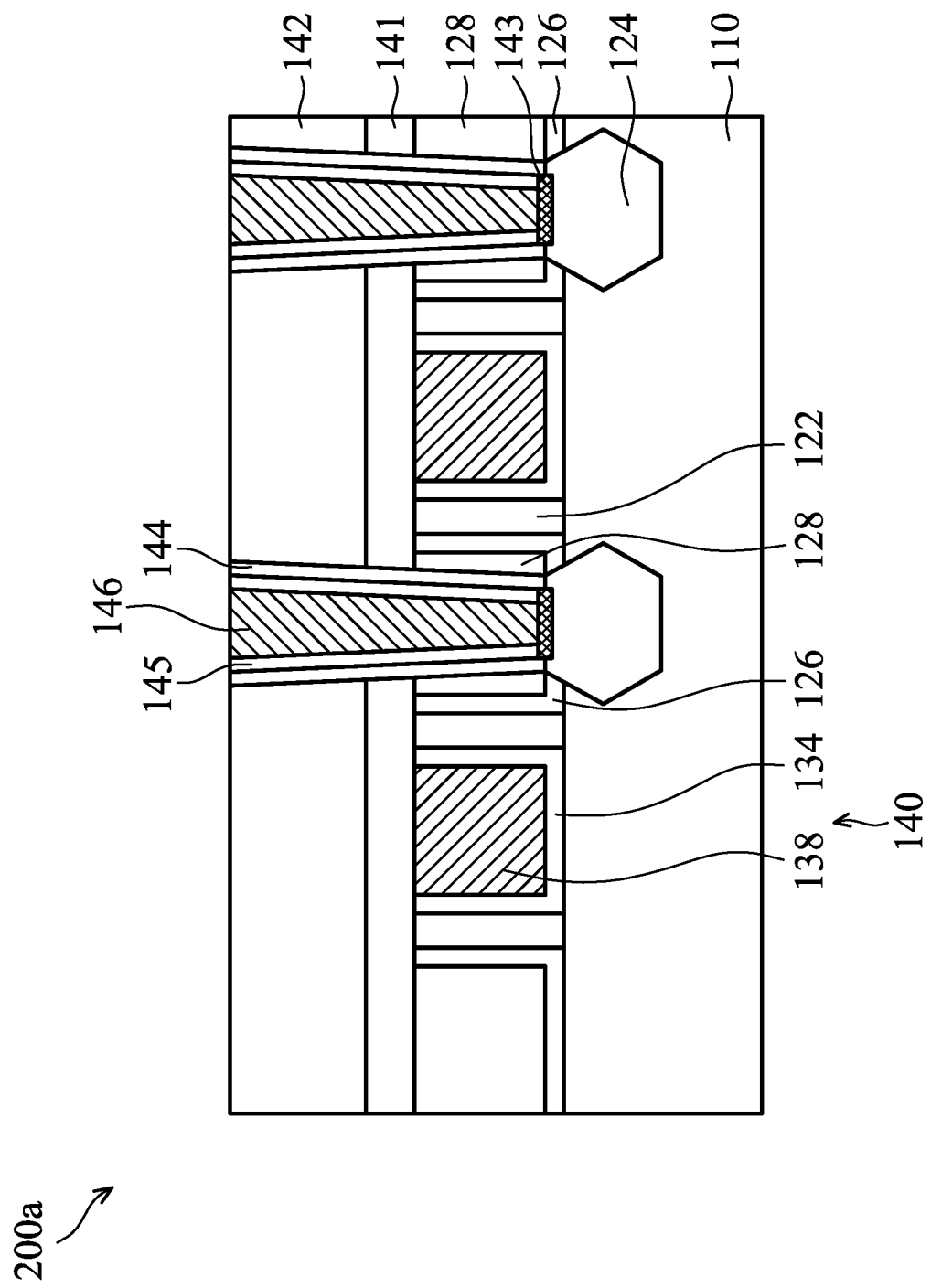
FIGS. 5A-5F show cross-sectional representations of various stages of forming a FinFET device structure after the FinFET device structure of FIG. 1J, in accordance with some embodiments of the disclosure.

FIGS. 5A-5F show cross-sectional representations of various stages of forming a FinFET device structure 200a after the FinFET device structure of FIG. 1J, in accordance with some embodiments of the disclosure. FIG. 5A is a cross-sectional representation taken along line I-I' of FIG. 1K.

Figure 5B:
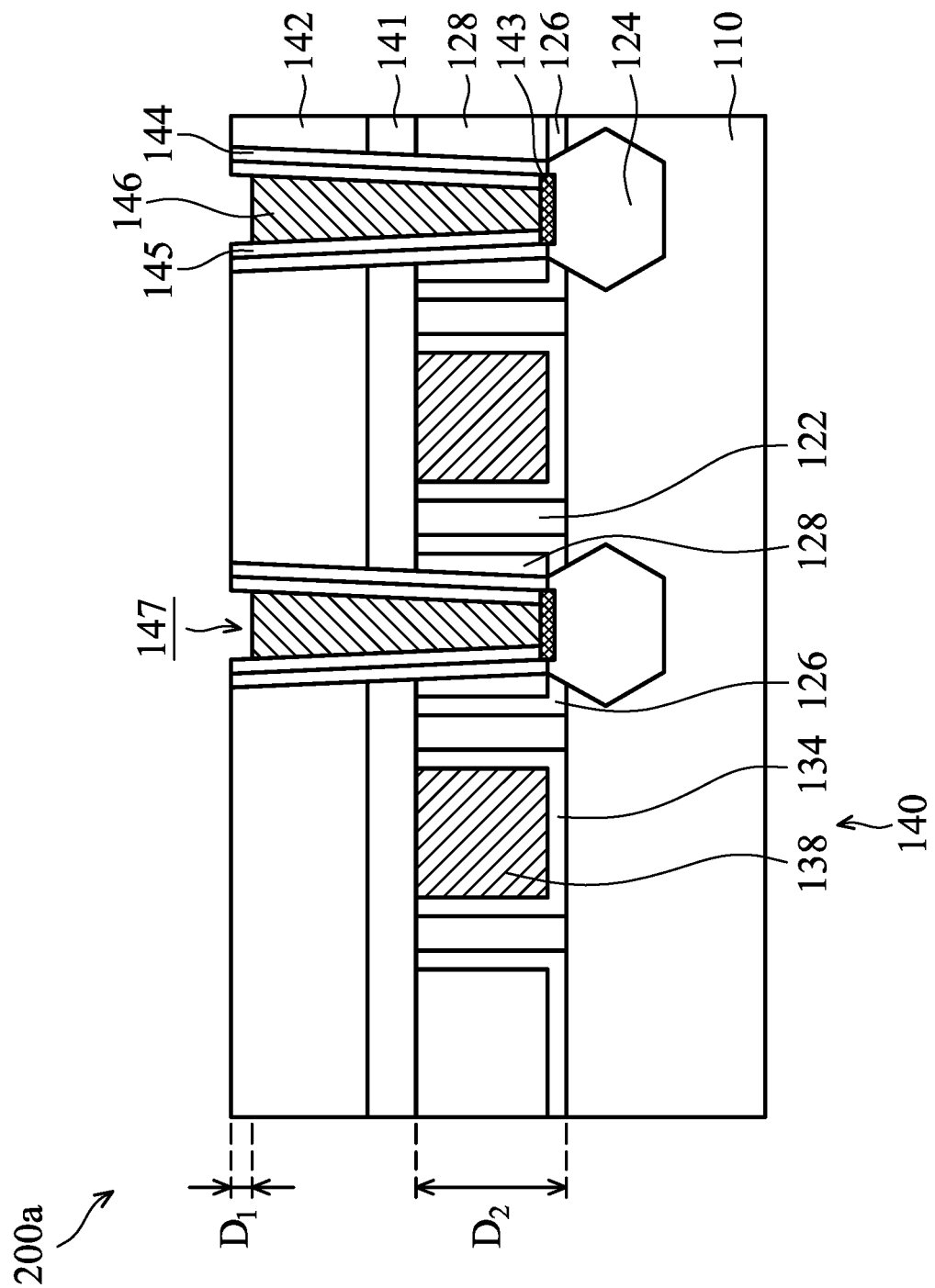

The structure shown in FIG. 5A is similar to the structure shown in FIG. 2A. Afterwards, as shown in FIG. 5B, a portion of the S/D contact structure 146 is removed to form an opening 147. The top surface of the S/D contact structure 146 and the sidewall of the barrier layer 145 are exposed by the opening 147.

The portion of the S/D contact structure 146 is removed by using a wet etching process. In some embodiments, the wet etching process includes using ammonia solution ($NH_4OH$).

The opening 147 has a first depth $D_1$ which is measured from the top surface of the first dielectric layer 142 to a bottom surface of the opening 147. The gate structure 140 has a second depth $D_2$. In some embodiments, the first depth $D_1$ is in a range from about 5 nm to about 10 nm. If the first depth $D_1$ is too small, the protection effect of the protection layer 150 may be not good enough. If the first depth $D_1$ is too large, the the S/D contact structure 146 may have a unwanted high resistance Rc. In some embodiments, the second depth $D_2$ is in a range from about 15 nm to about 25 nm. In some embodiments, a ratio of the first depth $D_1$ to the second depth $D_2$ is in a range from about ½ to about ⅓.

Figure 5C:
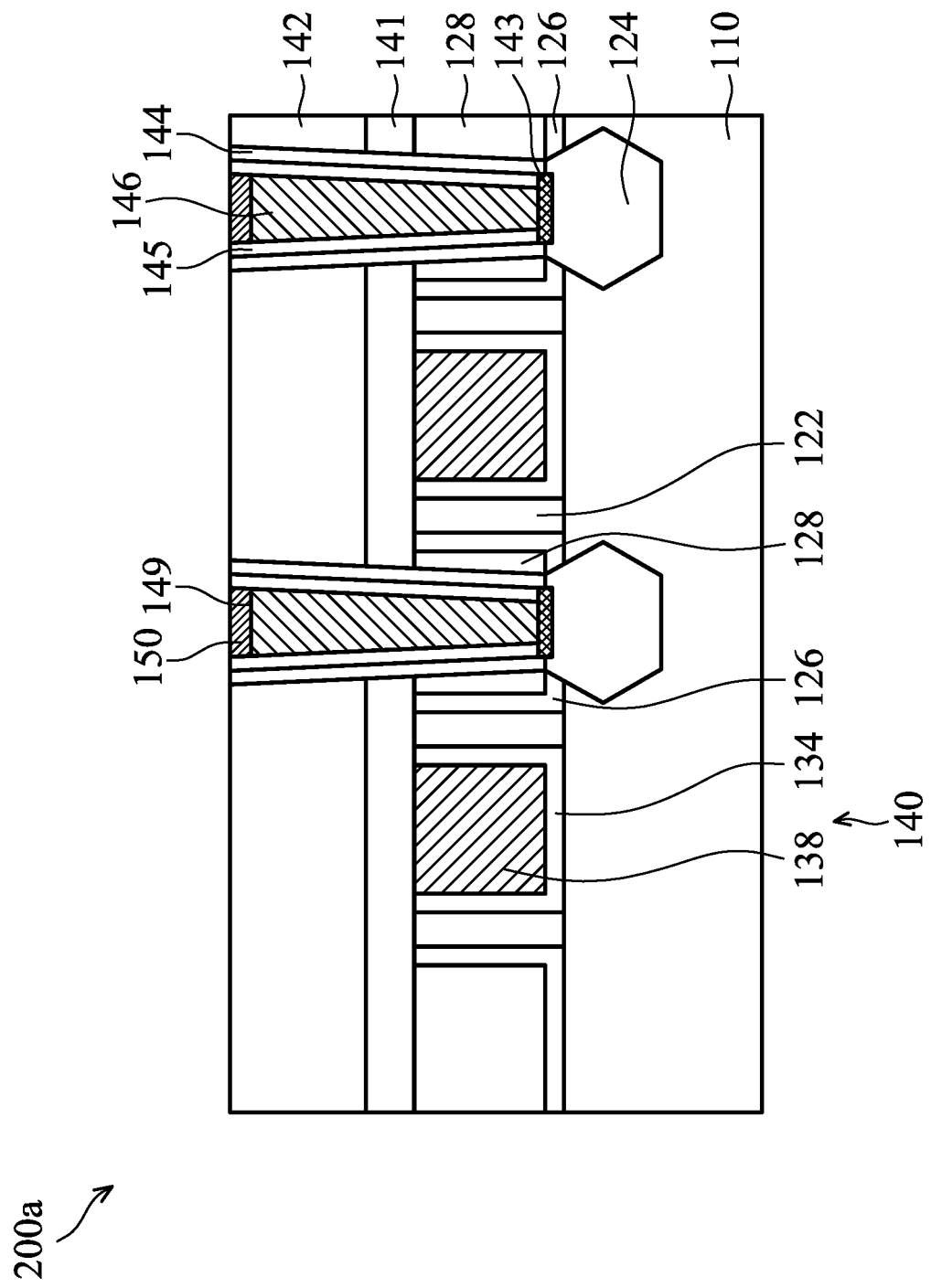

Subsequently, as shown in FIG. 5C, after the opening 147 is formed, the protection layer 150 is selectively formed on the top surface of the S/D contact structure 146. The fabrication method of the protection layer 150 includes performing the surface treatment process and then performing the deposition process. The surface treatment process and the deposition process are the same as, or similar to, the surface treatment process 10 and the deposition process 20 as described in FIGS. 1L and 1M.

In some embodiments, the top surface of the protection layer 150 is substantially level with the top surface of the first dielectric layer 142. In some other embodiments, the top surface of the protection layer 150 is slightly higher than the top surface of the first dielectric layer 142.

Figure 5D:
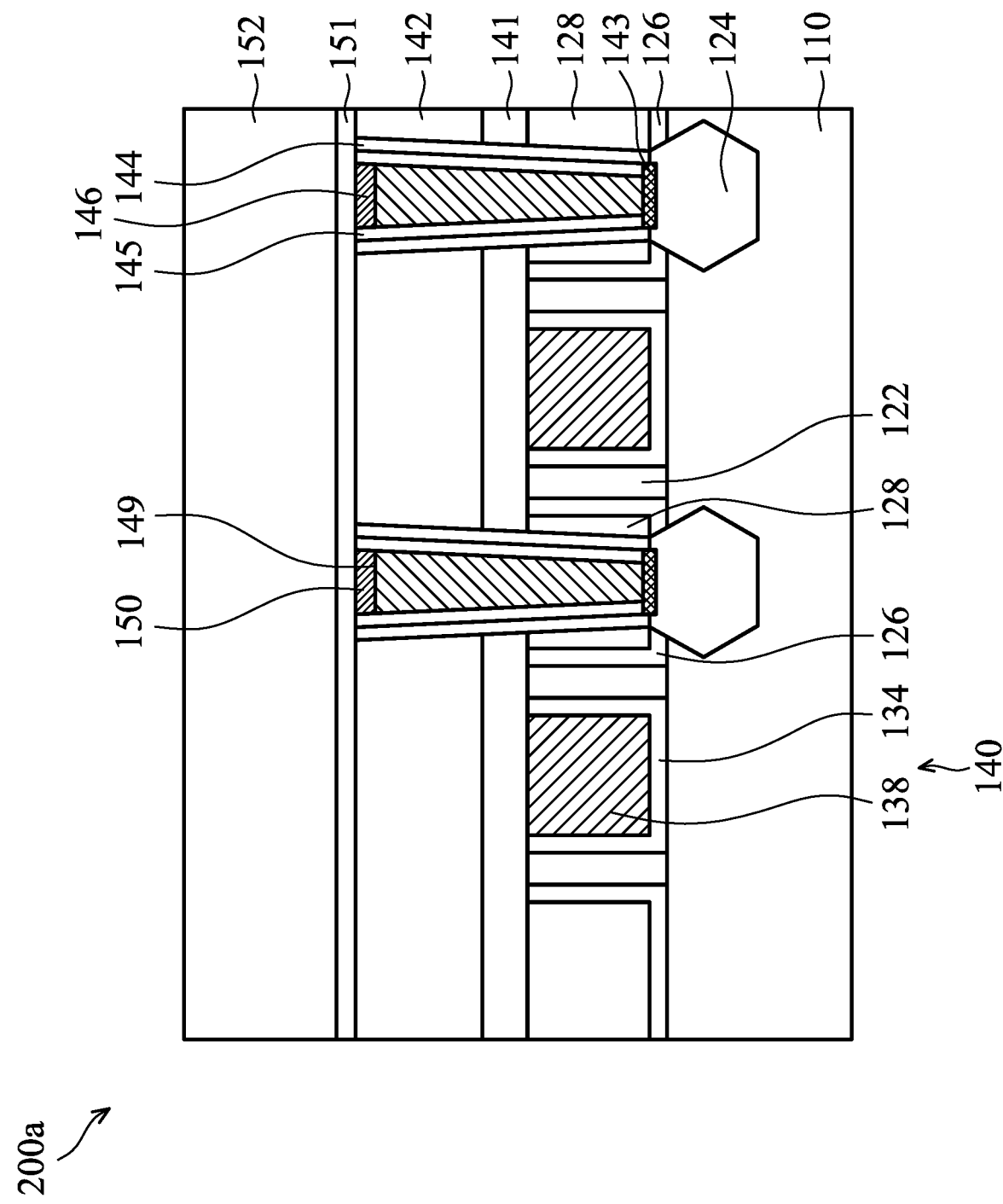

Afterwards, as shown in FIG. 5D, the second etching stop layer 151 is formed on the protection layer 150, and the second dielectric layer 152 is formed on the second etching stop layer 151, in accordance with some embodiments.

Figure 5E:
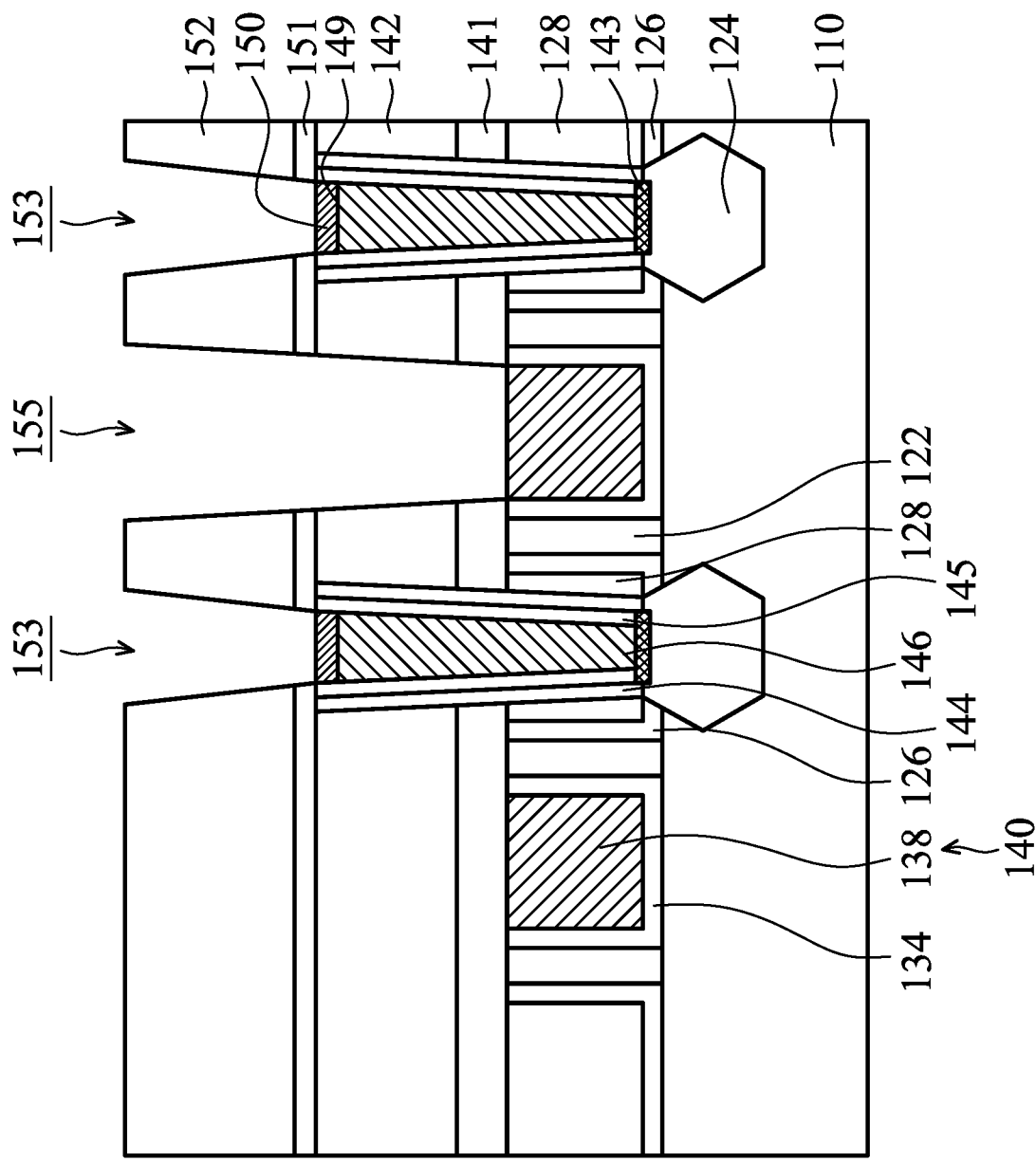

Subsequently, as shown in FIG. 5E, the first recess 153 is formed to expose the top surface of the protection layer 150, and the second recess 155 is formed to expose the top surface of the gate structure 140, in accordance with some embodiments. It should be noted that the S/D contact structure 146 is not exposed by the first recess 153 since the protection layer 150 provides protection for the underlying layers.

Figure 5F:
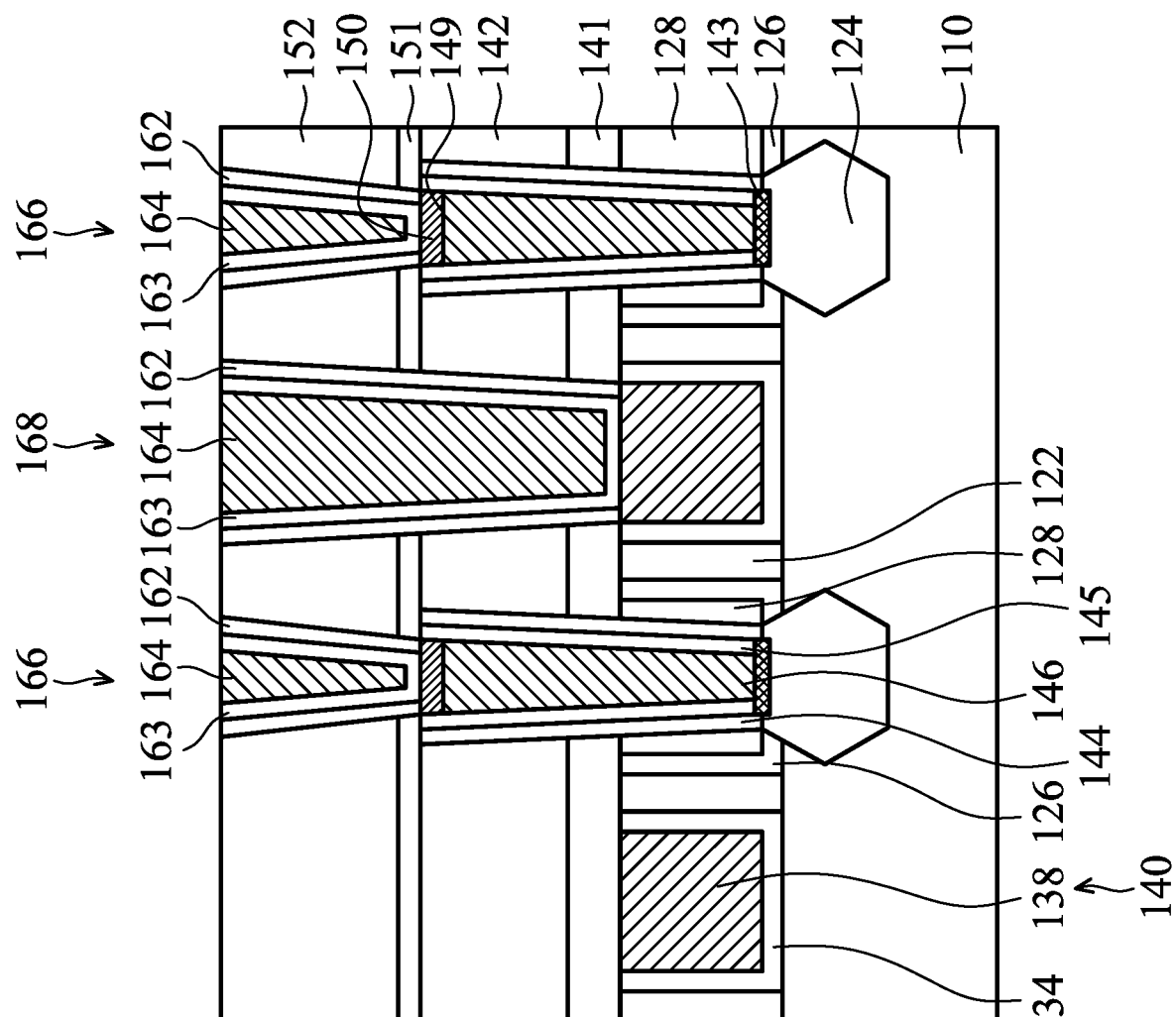

Afterwards, as shown in FIG. 5F, the insulating layer 162 and the barrier layer 163 are formed in the first recess 153 and the second recess 155, in accordance with some embodiments. Afterwards, the conductive layer 164 is formed over the barrier layer 163. The S/D conductive plug 166 includes the U-shaped barrier layer 163 and the conductive layer 164, and the gate contact structure 168 includes the U-shaped barrier layer 163 and the conductive layer 164. The S/D conductive plug 166 is directly formed on the S/D contact structure 146, and the gate contact structure 168 is directly formed on the gate structure 140.

Figure 6:
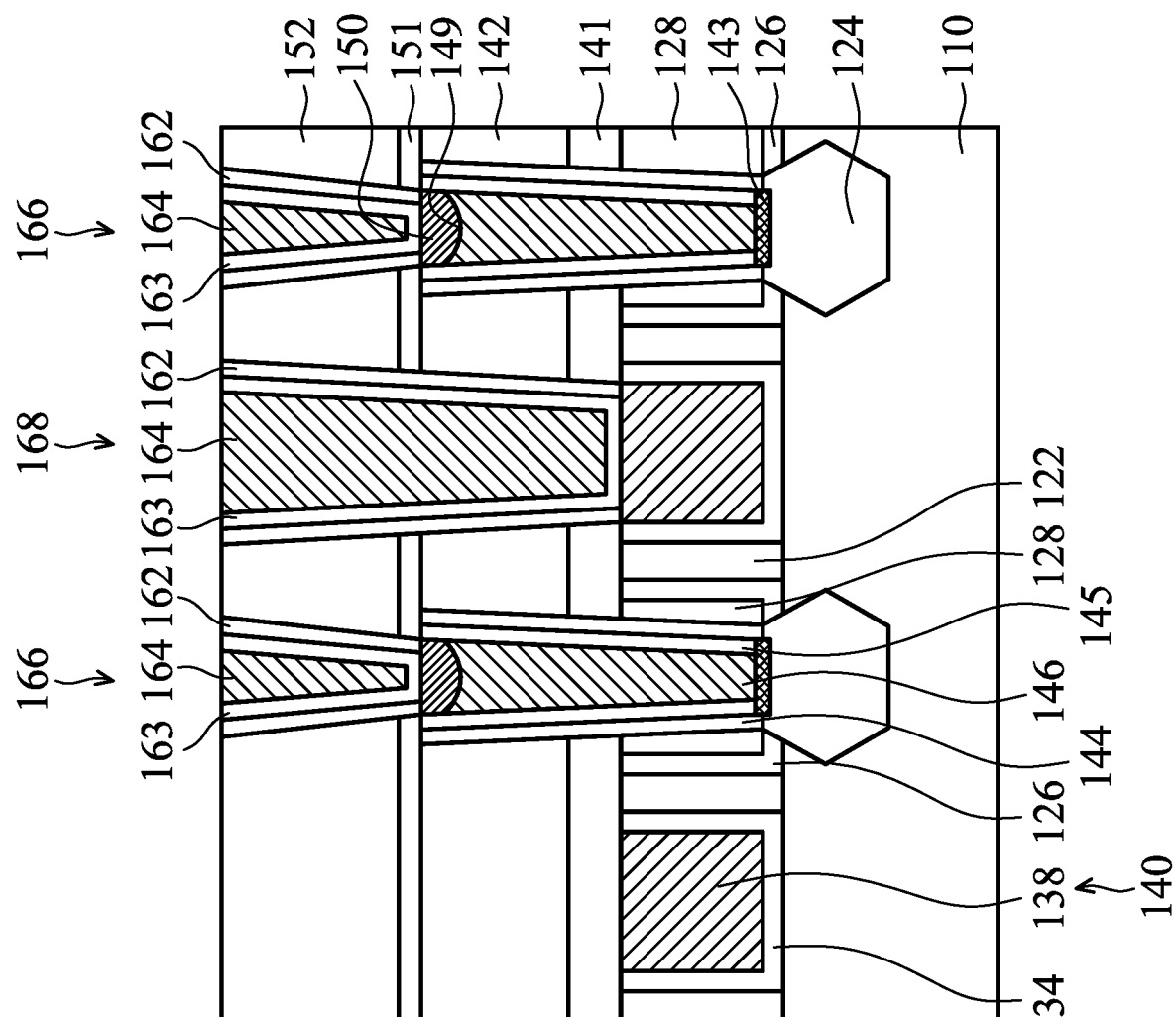
FIG. 6 shows a cross-sectional representation of a modified FinFET device structure, in accordance with some embodiments of the disclosure.

FIG. 6 shows a cross-sectional representation of a modified FinFET device structure 200b, in accordance with some embodiments of the disclosure. The FinFET device structure 200b of FIG. 6 is similar to the FinFET device structure 200a of FIG. 3F, and the difference between FIG. 6 and FIG. 3F is that the top surface of the S/D contact structure 146 is not planar since the top portion of the S/D contact structure 146 is not removed uniformly. A recess (not shown) is firstly formed in the S/D contact structure 146, and the recess has a curved bottom surface. Afterwards, the protection layer 150 is formed in the recess. Therefore, the protection layer 150 also have curved bottom surface. More specifically, the interface 149 between the S/D contact structure 146 and the protection layer 150 is un-even or non-linear. The middle portion of the S/D contact structure 146 is higher than the edge portion of the S/D contact structure 146.

Figure 7:
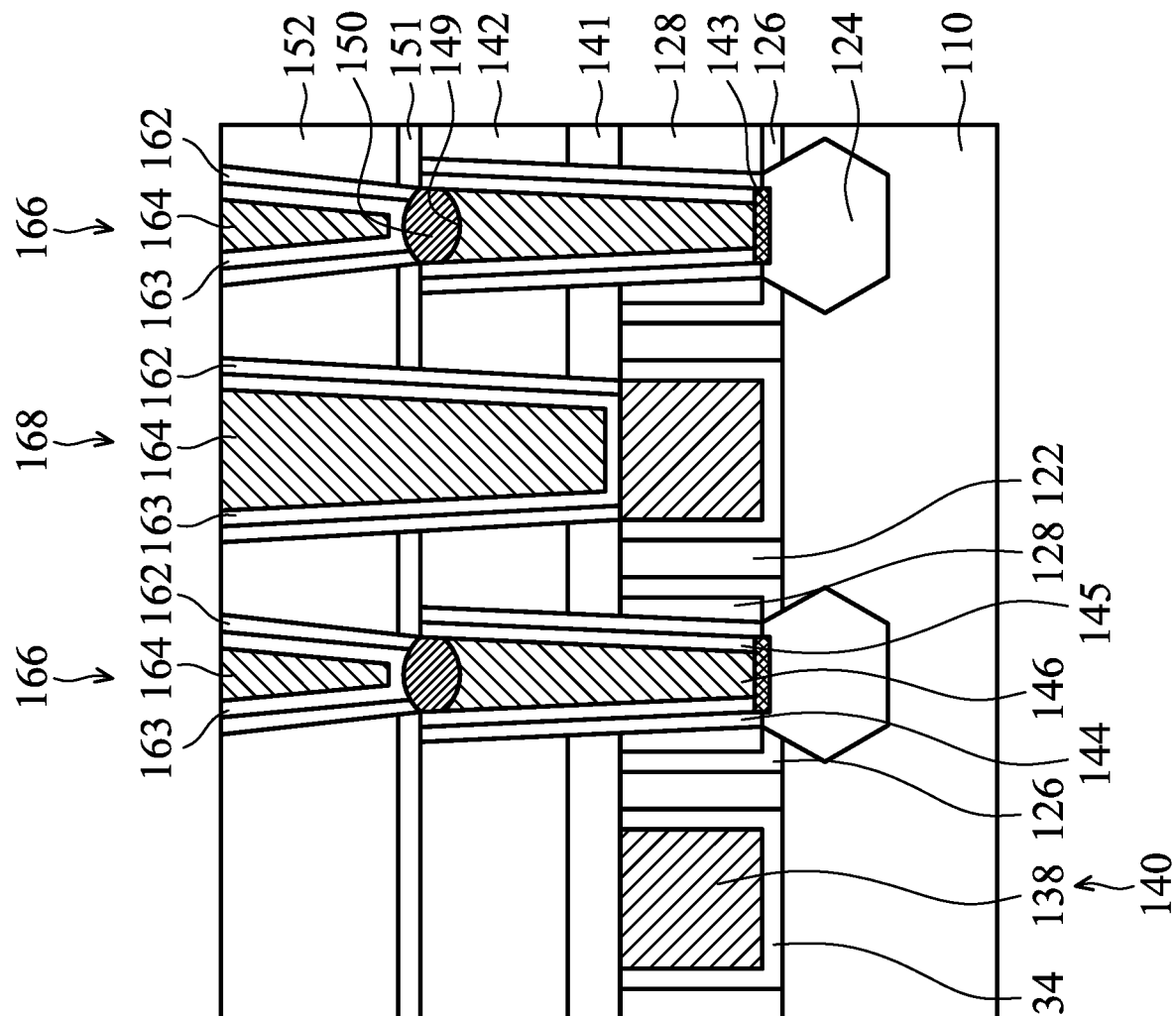
FIG. 7 shows a cross-sectional representation of a modified FinFET device structure, in accordance with some embodiments of the disclosure.

FIG. 7 shows a cross-sectional representation of a modified FinFET device structure 200c, in accordance with some embodiments of the disclosure. The FinFET device structure 200c of FIG. 7 is similar to the FinFET device structure 200a of FIG. 3F, the difference between FIG. 7 and FIG. 3F is that the protection layer 150 protrudes from the top surface of the first dielectric layer 142. The middle portion of the protection layer 150 is higher than the edge portion of the protection layer 150. A portion of the protection layer 150 is higher than the top surface of the first dielectric layer 142.

As mentioned above, the protection layer 150 is selectively formed on the top surface of the S/D contact structure 146. In some embodiments, the protection layer 150 is higher than a top surface of the first dielectric layer 142. In some other embodiments, the protection layer 150 is embedded in the first dielectric layer 142, and the sidewall surface of the protection layer 150 is in direct contact with the barrier layer 145. The protection layer 150 is used to protect the underlying layers from being damaged or polluted. The S/D conductive plug 146 is formed over the protection layer 150, and the S/D conductive plug 164 is electrically connected to the S/D contact structure 146 by the protection layer 150. The contact resistance between the S/D conductive plug 146 and the S/D conductive plug 164 are therefore improved.

Since the protection layer 150 is selectively formed on the S/D contact structure 146, no additional mask layer is used to define the location of the protection layer 150, and the alignment of the protection layer 150 become more easily. The protection layer 150 is not formed by the photolithography process. Therefore, the fabrication time and cost are reduced.

Embodiments for forming a FinFET device structure and method for formation the same are provided. The FinFET device structure includes a fin structure formed over a substrate, and a gate structure formed over the fin structure. An S/D structure is formed adjacent to the gate structure, and an S/D contact structure is formed on the S/D structure. A protection layer is selectively formed on the top surface of the S/D contact structure and formed in a dielectric layer. The protection layer may protrude above the top surface of the dielectric layer or below the top surface of the dielectric layer. An S/D conductive plug is formed over and electrically connected to the S/D contact structure by the protection layer. The protection layer is configured to protect the S/D contact structure from being etched or damaged. The S/D contact structure is not etched or removed by the following steps due to the protection of the protection layer. Therefore, the performance of the FinFET device structure is improved.

In some embodiments, a method for forming a FinFET device structure is provided. The method includes forming a gate structure over a fin structure and forming a source/drain (S/D) structure adjacent to the gate structure. The method also includes forming an S/D contact structure over the S/D structure and depositing a protection layer over the S/D contact structure. The protection layer and the S/D contact structure are made of different materials. The method further includes forming an etching stop layer over the protection layer and forming a dielectric layer over the etching stop layer. The method includes forming a first recess through the dielectric layer and the etching stop layer to expose the protection layer and forming an S/D conductive plug in the first recess. The S/D conductive plug comprises a barrier layer directly on the protection layer, and the protection layer and the barrier layer are made of different materials.

In some embodiments, a method for forming a FinFET device structure is provided. The method includes forming a gate structure over a fin structure and forming a source/drain (S/D) structure adjacent to the gate structure. The method includes forming an S/D contact structure over the S/D structure and performing a surface treatment process on a top surface of the S/D contact structure. The method also includes performing a deposition process on the top surface of the S/D contact structure to form a protection layer on the S/D contact structure. The protection layer has a middle portion and an edge portion, and the middle portion is higher than the edge portion. The method further includes forming a barrier layer directly on the protection layer, and the protection layer and the barrier layer are made of different materials.

In some embodiments, a FinFET device structure is provided. The FinFET device structure includes a fin structure formed over a substrate and a gate structure formed over the fin structure. The FinFET device structure also includes a source/drain (S/D) structure formed over the fin structure and adjacent to the gate structure and an S/D contact structure formed over the S/D structure and adjacent to the gate structure. The FinFET device structure includes a protection layer formed on the S/D contact structure, and the protection layer and the S/D contact structure are made of different materials. The protection layer has a middle portion and an edge portion, and the middle portion is higher than the edge portion The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for a fin field effect transistor (FinFET) device structure, comprising:
   forming a gate structure over a fin structure;
   forming a source/drain (S/D) structure adjacent to the gate structure;
   forming an S/D contact structure over the S/D structure;
   performing a surface treatment process on a top surface of the S/D contact structure;
   selectively forming a protection layer on the S/D contact structure by performing a deposition process, wherein the protection layer has a middle portion and an edge portion, and the middle portion is higher than the edge portion, wherein a sidewall of the protection layer is aligned with a sidewall of the S/D contact structure; and
   forming a barrier layer directly on the protection layer, and the protection layer and the barrier layer are made of different materials.

2. The method for forming the fin field effect transistor FinFET) device structure as claimed in claim 1, further comprising:
   removing a portion of the S/D contact structure to form an opening before performing the deposition process; and
   forming the protection layer in the opening.

3. The method for forming the fin field effect transistor (FinFET) device structure as claimed in claim 1, wherein the surface treatment process comprises using a hydrogen ($H_2$) gas.

4. The method for forming the fin field effect transistor (FinFET) device structure as claimed in claim 1, wherein performing the deposition process comprises using a precursor, and the precursor comprises tungsten (W)-containing material, and the tungsten-containing material comprises tungsten hexafluoride ($WF_6$) or tungsten hexachloride ($WCl_6$).

5. The method for forming the fin field effect transistor FinFET) device structure as claimed in claim 1, further comprising:
forming a metal silicide layer over the S/D structure, wherein the metal silicide layer is between the S/D structure and the S/D contact structure.

6. The method for forming the fin field effect transistor (FinFET) device structure as claimed in claim 1, further comprising:
forming an etching stop layer over the protection layer; and
removing a portion of the etching stop layer to form a first recess, wherein the protection layer is exposed by the first recess.

7. The method for forming the fin field effect transistor (FinFET) device structure as claimed in claim 1, further comprising:
forming a barrier layer surrounding the S/D contact structure, wherein the protection layer is not formed on the barrier layer.

8. A method for a fin field effect transistor (FinFET) device structure, comprising:
forming a gate structure over a fin structure;
forming a source/drain (S/D) structure adjacent to the gate structure;
forming an S/D contact structure over the S/D structure;
forming a barrier layer surrounding the S/D contact structure;
depositing a protection layer over the S/D contact structure, wherein the protection layer and the S/D contact structure are made of different materials, and the protection layer is not formed on the barrier layer;
forming an etching stop layer over the protection layer;
forming a dielectric layer over the etching stop layer;
forming a first recess through the dielectric layer and the etching stop layer to expose the protection layer; and
forming an S/D conductive plug in the first recess, wherein the S/D conductive plug comprises a barrier layer directly on the protection layer, and the protection layer and the barrier layer are made of different materials.

9. The method for forming the fin field effect transistor (FinFET) device structure as claimed in claim 8, wherein depositing the protection layer over the S/D contact structure comprises:
removing a portion of the S/D contact structure to form an opening; and
forming the protection layer in the opening.

10. The method for forming the fin field effect transistor (FinFET) device structure as claimed in claim 8, wherein depositing the protection layer comprises:
performing a surface treatment process on a top surface of the S/D contact structure; and
performing a deposition process on the top surface of the S/D contact structure, wherein the deposition process comprises supplying a precursor on the top surface of the S/D contact structure.

11. The method for forming the tin field effect transistor (FinFET) device structure as claimed in claim 10, wherein the surface treatment process comprises using a hydrogen ($H_2$) gas.

12. The method for forming the fin field effect transistor (FinFET) device structure as claimed in claim 10, wherein the precursor comprises tungsten (W)-containing material, and the tungsten-containing material comprises tungsten hexafluoride ($WF_6$) or tungsten hexachloride ($WCl_6$).

13. The method for forming the fin field effect transistor (FinFET) device structure as claimed in claim 8, further comprising:
forming an insulating layer surrounding the barrier layer, wherein the barrier layer and the insulating layer are made of different materials.

14. The method for forming the tin field effect transistor (FinFET) device structure as claimed in claim 8, wherein the protection layer has a middle portion and an edge portion, and the middle portion is higher than the edge portion.

15. The method for forming the fin field effect transistor F device structure as claimed in claim 8, further comprising:
forming a metal suicide layer over the S/D structure, wherein the metal silicide layer is between the S/D structure and the S/D contact structure.

16. A method for a fin field effect transistor (FinFET) device structure, comprising:
forming a gate structure over a fin structure;
forming a dielectric layer over the gate structure;
forming a source/drain (S/D) contact structure in the dielectric layer and adjacent to the gate structure;
removing a portion of the S/D contact structure, such that a top surface of the S/D contact structure is lower than a top surface of the dielectric layer;
performing a surface treatment process on the top surface of the S/D contact structure; and
selectively forming a protection layer on the S/D contact structure.

17. The method for forming the fin field effect transistor (FinFET) device structure as claimed in claim 16, wherein a top surface of the protection layer is higher than the top surface of the dielectric layer.

18. The method for forming the fin field effect transistor (FinFET) device structure as claimed in claim 16, further comprising:
forming a barrier layer directly on the protection layer, wherein the protection layer and the barrier layer are made of different materials.

19. The method for forming the fin field effect transistor (FinFET) device structure as claimed in claim 16, further comprising:
forming an S/D structure over the fin structure; and
forming a metal silicide layer over the S/D structure, wherein the metal silicide layer is between the S/D structure and the S/D contact structure.

20. The method for forming the fin field effect transistor (FinFET) device structure as claimed in claim 16, wherein the protection layer has a curved bottom surface.

* * * * *